(12) United States Patent
Katsuhara et al.

(10) Patent No.: US 8,395,147 B2
(45) Date of Patent: Mar. 12, 2013

(54) THIN FILM TRANSISTOR AND METHOD FOR PRODUCING THE SAME

(75) Inventors: Mao Katsuhara, Kanagawa (JP); Nobuhide Yoneya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/448,969

(22) Filed: Apr. 17, 2012

(65) Prior Publication Data

US 2012/0199836 A1    Aug. 9, 2012

Related U.S. Application Data

(60) Continuation of application No. 13/176,443, filed on Jul. 5, 2011, which is a division of application No. 12/627,434, filed on Nov. 30, 2009, now Pat. No. 8,008,115.

(30) Foreign Application Priority Data

Nov. 28, 2008 (JP) ................................ P2008-303432

(51) Int. Cl.
 *H01L 51/00* (2006.01)
(52) U.S. Cl. ... 257/40; 257/288; 257/410; 257/E51.005; 257/E51.007; 438/99; 438/197; 438/216
(58) Field of Classification Search .................... 257/40, 257/288, 410, E51.005, E51.007; 438/99, 438/197, 216
See application file for complete search history.

(56) References Cited

U.S. PATENT DOCUMENTS

| 7,776,662 | B2 | 8/2010 | Wang et al. |
| 2006/0046339 | A1 | 3/2006 | Seo et al. |
| 2007/0148812 | A1 | 6/2007 | Wu et al. |
| 2008/0105873 | A1 | 5/2008 | Wang et al. |
| 2008/0198102 | A1 | 8/2008 | Yamashita et al. |
| 2009/0065784 | A1 | 3/2009 | Kobayashi et al. |
| 2012/0012825 | A1* | 1/2012 | Katsuhara et al. .............. 257/40 |

FOREIGN PATENT DOCUMENTS

| DE | 10 2005 030 675 A1 | 3/2006 |
| JP | 2006-216718 | 8/2006 |

OTHER PUBLICATIONS

Extended European Search Report issued Sep. 9, 2012 for corresponding European Application No. 098290071.1—1235/2355139.

* cited by examiner

*Primary Examiner* — Tu-Tu Ho
(74) *Attorney, Agent, or Firm* — K&L Gates LLP

(57) ABSTRACT

The present invention provides a method of manufacturing a thin film transistor of a top-contact structure with suppressed deterioration by a process which is easy and suitable for increase in area without damaging an organic semiconductor pattern. The organic semiconductor pattern is formed on a substrate. An electrode material film is formed on the substrate so as to cover the organic semiconductor pattern. A resist pattern is formed on the electrode material film. By wet etching using the resist pattern as a mask, the electrode material film is patterned. By the process, a source electrode and a drain electrode are formed.

12 Claims, 15 Drawing Sheets

THIN FILM TRANSISTOR AND METHOD FOR PRODUCING THE SAME

CROSS REFERENCES TO RELATED APPLICATIONS

The present application is a continuation of U.S. patent application Ser. No. 13/176,443 filed on Jul. 5, 2011, which is a divisional of U.S. patent application Ser. No. 12/627,434 filed on Nov. 30, 2009, which claims priority to Japanese Patent Application JP 2008-303432 filed in the Japanese Patent Office on Nov. 28, 2008, the entire contents of which is being incorporated herein by reference.

BACKGROUND

1. Field of the Invention

The present invention relates to a method of manufacturing a thin film transistor, a thin film transistor, and an electronic device. More particularly, the invention relates to a method of manufacturing a thin film transistor in which fine source and drain electrodes are formed over an organic semiconductor pattern, a thin film transistor obtained by the method, and an electronic device using the thin film transistor.

2. Description of the Related Art

In recent years, attention is paid to a thin film transistor (TFT) using an organic semiconductor as a channel layer, a so-called organic TFT. Since the organic TFT is formed by applying a channel layer made of organic semiconductor at low temperature, it is advantageous to reduction of cost. The organic TFT is also formed on a flexible substrate having no heat resistance property such as a plastic substrate. It is known that, in an organic TFT having a top-contact bottom-gate structure, deterioration in characteristics due to stress of heat or the like is suppressed as compared with an organic TFT having a bottom-contact structure.

In manufacture of such an organic TFT of the top-contact bottom-gate structure, a method of patterning a source electrode and a drain electrode with high precision on an organic semiconductor pattern is being examined. For example, Japanese Unexamined Patent Application Publication No. 2006-216718 discloses a method of providing an intersecting part which halves a space above a substrate, forming an organic semiconductor pattern by vapor deposition from two directions, and vapor-depositing a metal material so as to be divided by the intersecting part, thereby forming a source electrode and a drain electrode.

SUMMARY

However, in the manufacturing method using the intersecting part which halves a space above a substrate, formation of the intersection part is troublesome, and it is difficult to form a source electrode and a drain electrode with uniform precision over a substrate of large area.

It is therefore desirable to provide a method of manufacturing a thin film transistor of a top-contact structure with suppressed deterioration by a process which is easy and suitable for increase in area without damaging an organic semiconductor pattern, a thin film transistor having a top-contact structure obtained by applying the method and, further, an electronic device having the thin film transistor.

A method of manufacturing a thin film transistor of the present invention for achieving such a purpose is performed by the following procedure.

First, an organic semiconductor pattern is formed on a substrate. Next, an electrode material film is formed on the substrate so as to cover the organic semiconductor pattern. After that, a resist pattern is formed on the electrode material film, and a source electrode and a drain electrode obtained by patterning the electrode material film by wet etching using the resist pattern as a mask are formed.

In the method of manufacturing a thin film transistor, the electrode material film is etched using the resist pattern as a mask, so that the source electrode and the drain electrode patterned with high precision are formed. Since wet etching is performed as the etching of the electrode material film, the organic semiconductor layer under the electrode material film is prevented from being damaged. Further, since the etching process using the resist pattern as a mask is performed, the method is easy and suitable for increase in area.

A thin film transistor as an embodiment of the present invention is formed by the above-described method and has: an organic semiconductor pattern provided on a substrate; and a source electrode and a drain electrode provided over the substrate in a state where they are isolated from each other above the semiconductor pattern. In particular, each of the source and drain electrodes has an end face shape which is isotropically etched.

According to a method of manufacturing a thin film transistor of an embodiment of the invention, while applying a process which is easy and suitable for increase in area, a thin film transistor of a top-contact structure with suppressed deterioration is obtained with high precision without damaging an organic semiconductor pattern. By using a thin film transistor obtained in such a manner, an electrode device with suppressed deterioration is obtained.

DETAILED DESCRIPTION OF THE PREFERRED EMBODIMENTS

Embodiments of the present invention will be described with reference to the drawings below in the following order.

1. First embodiment (method of manufacturing a thin film transistor)
2. Second embodiment (an example of over-etching an organic semiconductor pattern)
3. Third embodiment (an example of leaving a protection film pattern on an organic semiconductor pattern)
4. Fourth embodiment (an example of using a carrier injection material as a protection film and a protection film pattern and leaving them)
5. Fifth embodiment (an example of using a protection film pattern as a stacking structure and leaving it)
6. Sixth embodiment (an example of reducing contact resistance)
7. Seventh embodiment (another example of reducing contact resistance)
8. Eight embodiment (another example of reducing contact resistance)
9. Example of application to electronic device (display device)

1. First Embodiment

FIGS. 1A to 1D and FIGS. 2A to 2D are sectional process drawings of a first example of applying a method of manufacturing a thin film transistor according to a first embodiment of the present invention to manufacture of a top-contact bottom-gate structure. FIG. 3 is a plan view of a thin film transistor of the top-contact bottom-gate structure manufactured in the example. In the following, according to the sectional process drawings of FIGS. 1A to 1D and FIGS. 2A to 2D, referring to FIG. 3, the manufacturing method of the first embodiment will be described.

Figure 1A:
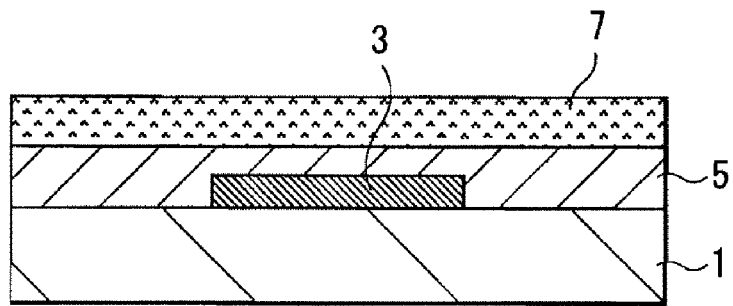
FIGS. 1A to 1D are sectional process drawings (No. 1) for explaining a first embodiment of the present invention.

First, as illustrated in FIG. 1A, a gate electrode 3 is formed in a pattern on an insulating substrate 1, a gate insulating film 5 is formed so as to cover the gate electrode 3 and, further, an organic semiconductor layer 7 is formed on the gate insulating film 5. The processes are performed in a normal procedure, for example, as follows.

The gate electrode 3 is formed in a pattern, for example, by forming a metal material film of gold (Au), platinum (Pt), silver (Ag), tungsten (W), tantalum (Ta), molybdenum (Mo), aluminum (Al), chromium (Cr), titanium (Ti), copper (Cu), nickel (Ni), or the like. The metal material film is formed by, for example, sputtering, vapor deposition, plating, or the like. After that, a resist pattern (not shown) is formed on the metal material film by photolithography. Using the resist pattern as a mask, the metal material film is etched to obtain the gate electrode 3. The method of forming the gate electrode 3 is not limited to the above-described method but printing or the like may be applied.

When the gate insulating film 5 is made of an inorganic material such as silicon oxide or silicon nitride, the gate insulating film 5 is formed by CVD or sputtering. On the other hand, when the gate insulating film 5 is made of an organic highpolymer material such as polyvinylphenol, PMMA, polyimide, fluorine resin, or the like, the gate insulating film 5 is formed by coating or printing.

The organic semiconductor layer 7 is formed by applying a film forming method which is properly selected according to a material used.

Examples of the organic semiconductor material to be used are as follows.
 polypyrrole and polypyrrole substitute,
 polythiophene and polythiophene substitute,
 isothianaphthenes such as polyisothianaphthene,
 chenylene vinylenes such as polychenylene vinylene,
 poly(p-phenylenevinylenes) such as poly(p-phenylenevinylene),
 polyaniline and polyaniline substitute,
 polyacetylenes,
 polydiacetylenes,
 polyazulenes,
 polypyrenes,
 polycarbazoles,
 polyselenophenes,
 polyfurans,
 poly(p-phenylenes),
 polyindoles,
 polypyridazines,
 polymers and polycyclic condensate such as polyvinyl carbazole, polyphenylene sulfide, or polyvinylene sulfide,
 derivatives (triphenodioxazine, triphenodithiazine, hexacene-6, 15-quinone, or the like) obtained by substituting oligomers having the same repeating unit as that of the polymer in the material, acenes such as naphthacene, pentacene, hexacene, dibenzopentacene, tetrabenzopentacene, pyrene, dizenzopyrene, chrysene, perylene, coronene, terrylene, ovalene, quaterrylene, and circumanthracene, and a part of carbon in the acenes with a functional group such as atoms of N, S, O, or the like, a carbonyl group, or the like,
 metal phthalocyanines,
 tetrathiafulvalene and tetrathiafulvalene derivatives,
 tetrathiapentalene and tetrathiapentalene derivatives,
 naphthalene 1,4,5,8-tetracarboxylic acid diimide, N,N'-bis (4-trifuoromethyl benzyl)naphthalene 1,4,5,8-tetracarboxylic acid diimide, N,N'-bis(1H, 1H-perfluorooctyl), N,N'-bis (1H, 1H-perfluorooctyl), and N,N'-dioctylnaphthalene 1,4,5, 8-tetracarboxylic acid diimide derivative,
 naphthalene tetracarboxylic acid diimides such as naphthalene 2,3,6,7 tetracarboxylic acid diimide,
 condensed-ring tetracarboxylic acid diimides such as anthracene tetracarboxylic acid diimides like anthracene 2,3, 6,7-tetracarboxylic acid diimide,
 fullerenes such as C60, C70, C76, C78, and C84,
 carbon nanotube such as SWNT, and
 pigments such as merocyanine dyes and hemicyanine dyes.

The organic semiconductor layer 7 made of any of the above materials may be formed by applying a method properly selected from the vacuum deposition methods such as resistance heating evaporation and sputtering and the coating method such as spin coating in accordance with a material to be used. Examples of the coating method include air doctor coating, blade coating, rod coating, knife coating, squeeze coating, reverse roll coating, transfer roll coating, gravure coating, kiss coating, cast coating, spray coating, slit orifice coating, calendar coating, and dip coating.

For example, as the organic semiconductor layer 7, a film made of pentacene and having a thickness of 50 nm is formed by vacuum evaporation.

Figure 1B:
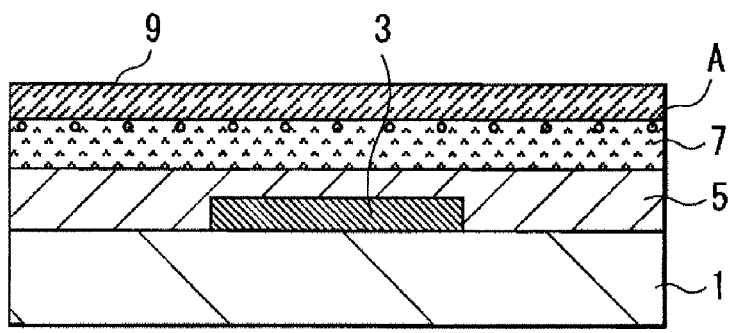

As shown in FIG. 1B, a protection film 9 is formed on the organic semiconductor layer 7. The protection film 9 is made of, for example, a metal material. Examples of the metal material of the protection film 9 include gold (Au), platinum (Pt), palladium (Pd), silver (Ag), tungsten (W), tantalum (Ta), molybdenum (Mo), aluminum (Al), chromium (Cr), titanium (Ti), copper (Cu), nickel (Ni), indium (In), tin (Sn), manganese (Mn), ruthenium (Rh), rubidium (Rb), and their compounds. The protection film 9 may have a stacked structure of the above-described materials.

The protection film 9 may be formed by applying a method properly selected from the resistance heating evaporation, the vacuum deposition method such as sputtering, or the above-described various coating methods.

For example, a film made of gold (Au) is formed by vacuum deposition as the protection film 9.

By forming the protection film 9 made of the metal material in contact with the organic semiconductor layer 7, a metal material component A of the protection film 9 is slightly diffused into the surface layer of the organic semiconductor layer 7.

Figure 1C:
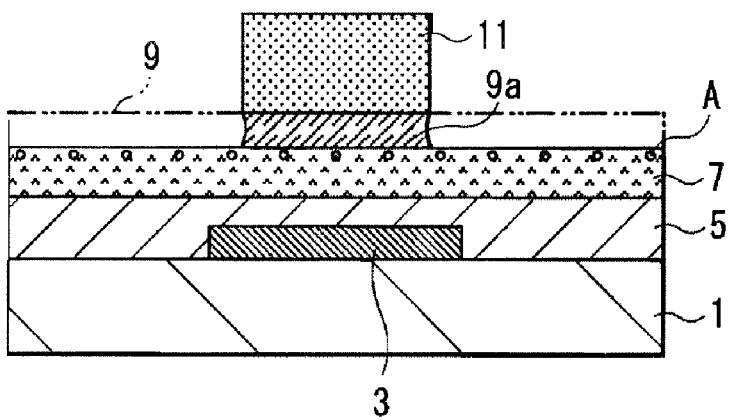

Next, as shown in FIG. 1C, a resist pattern 11 is formed on the protection film 9 in a position above the gate electrode 3. The resist pattern 11 is formed by applying the lithography method or the printing method. As the printing method, ink jet printing, screen printing, offset printing, gravure printing, flexographic printing, micro-contact printing, or the like may be used. In formation of the resist pattern 11, the organic semiconductor layer 7 is protected by the protection film 9.

Subsequently, using the resist pattern 11 as a mask, the protection film 9 is etched to form a protection film pattern 9a on the organic semiconductor layer 7. As the etching for the protection film 9, wet etching is employed.

As etchant, for example, a solution made of acid such as nitric acid, sulfuric acid, hydrochloric acid, acetic acid, oxalic acid, hydrofluoric acid, or hydrogen peroxide, salt such as ammonium fluoride, potassium iodide, permanganate, or bichromate, or mixture of the acid and the salt is used. To suppress damage on the organic semiconductor layer 7, the concentration of acids in the etchant is preferably 20% or less. To assure stable etching rate, an additive such as an organic nitrogen compound may be added.

After the protection film pattern 9a is formed by wet etching, the resist pattern 11 is removed. The resist pattern 11 is removed by dissolution cleaning removal by a wet process or ashing (dry etching). At the time of removing the resist pattern 11, the organic semiconductor layer 7 is protected by the protection film 9.

Figure 1D:
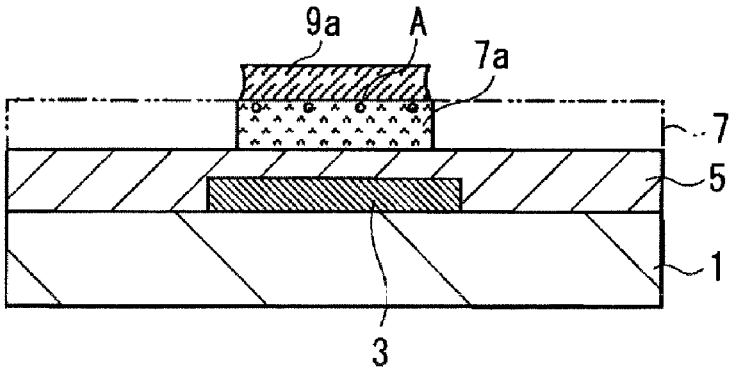

Next, as illustrated in FIG. 1D, using the protection film pattern 9a as a mask, the organic semiconductor layer 7 is etched and, in a state where a part on the gate electrode 3 is covered in the width direction of the gate electrode 3, an organic semiconductor pattern 7a is formed by dry etching. By the process, the thin film transistor to be formed is isolated.

Figure 2A:
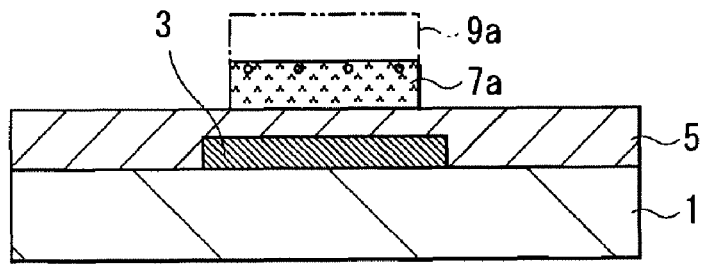
FIGS. 2A to 2D are sectional process drawings (No. 2) for explaining the first embodiment.
Figure 3:
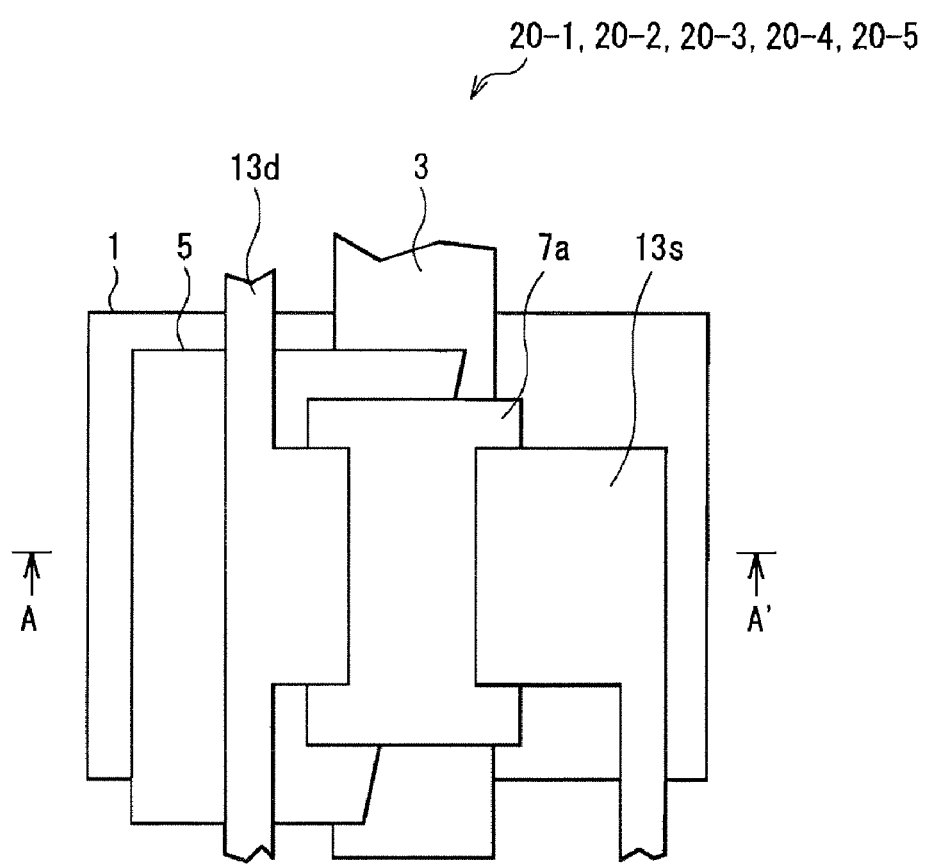
FIG. 3 is a schematic plan view of a thin film transistor of a top contact structure to which the present invention is applied.

As illustrated in FIG. 2A, the protection film pattern 9a is peeled off. The peel-off of the protection film pattern 9a is performed by wet etching. An etchant similar to that used at the time of forming the protection film pattern 9a by etching the protection film 9 is used.

Figure 2B:
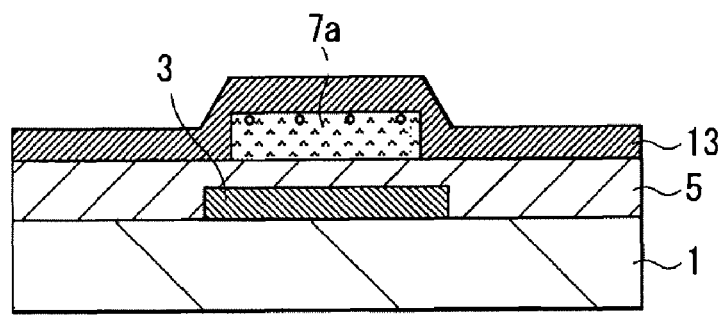

As illustrated in FIG. 2B, in a state where the organic semiconductor pattern 7a is covered, an electrode material film 13 is formed on the gate insulating film 5. The electrode material film 13 is provided to form a source electrode and a drain electrode and is made of a material, in a metal material or an organic conductive material, by which the film is formed without damaging the organic semiconductor pattern 7a and is in ohmic-contact with the organic semiconductor pattern 7a. The same material as that of the protection film 9 is used, and the electrode material film 13 is formed similarly. Particularly, from the viewpoint of ohmic-contact with the organic semiconductor pattern 7a, gold (Au), platinum (Pt), silver (Ag), copper (Cu), aluminum (Al), nickel (Ni), chromium (Cr), molybdenum (Mo), alloys and oxides of those elements, and the like are preferably used.

In this case, for example, a film made of gold (Au) is formed as the electrode material film 13 by the vacuum deposition method.

Figure 2C:
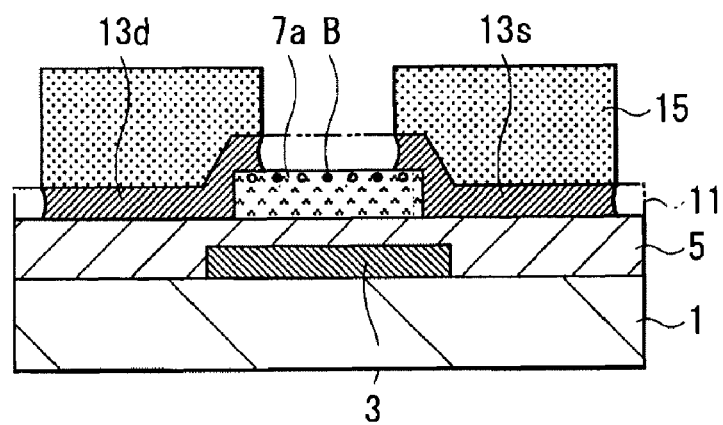

Next, as shown in FIG. 2C, a resist pattern 15 is formed on the electrode material film 13. The resist pattern 15 is formed by applying the lithography or printing method. As the printing method, ink jet printing, screen printing, offset printing, gravure printing, flexographic printing, micro-contact printing, or the like may be used. In formation of the resist pattern 15, the organic semiconductor pattern 7a is protected by the electrode material film 13.

Subsequently, using the resist pattern 15 as a mask, the electrode material film 13 is etched. By the operation, a source electrode 13s and a drain electrode 13d are formed, which are isolated from each other above the organic semiconductor pattern 7a and have a shape that an end portion is stacked on the organic semiconductor pattern 7a in positions where they face each other while sandwiching the gate electrode 3.

As the etching for the electrode material film 13, wet etching is employed. As etchant, an etchant similar to that for the protection film 9 is used. By an effect of the metal material component A of the protection film 9 slightly diffused into the surface layer of the organic semiconductor pattern 7a, corrosion caused by the etchant for the organic semiconductor pattern 7a is prevented. By the wet etching, an etchant component B in the etchant is slightly diffused in the surface layer of the semiconductor pattern 7a.

After the source electrode 13s and the drain electrode 13d are formed by wet etching, the resist pattern 15 is removed. Removal of the resist pattern 15 is performed in a manner similar to that of the resist pattern 11.

Figure 2D:
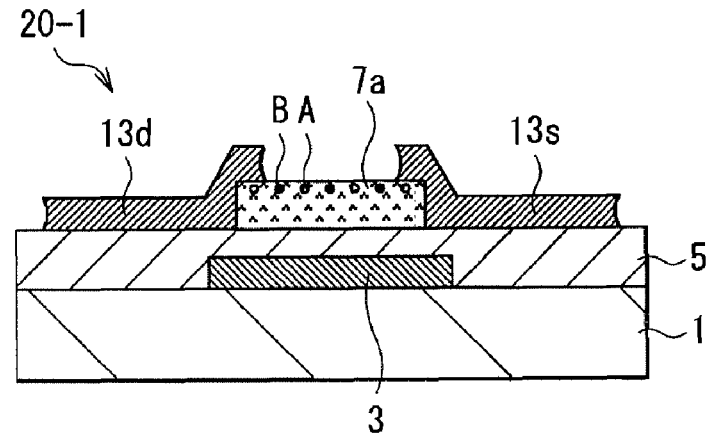

As a result, a thin film transistor 20-1 having the top-contact bottom-gate structure shown in FIGS. 2D and 3 is obtained.

In the thin film transistor 20-1 obtained in such a manner, an end face of each of the source electrode 13s and the drain electrode 13d isolated from each other above the organic semiconductor pattern 7a has a shape which is isotropically etched by wet etching.

In the first embodiment, the source electrode 13s and the drain electrode 13d are shaped by etching the electrode material film 13 using the resist pattern 15 as a mask. Consequently, the source electrode 13s and the drain electrode 7s patterned with high precision may be formed. The etching for the electrode material film 13 is wet etching, thereby preventing the organic semiconductor pattern 7a as an under layer from being damaged. Since the process is an etching process using the resist pattern as a mask, it is easy and is also suitable to increase the area.

As a result, while applying the process which is easy and suitable for increase in the area, the thin film transistor 20-1 having the top-contact structure with suppressed deterioration is obtained with high precision without damaging the organic semiconductor pattern 7a.

By the effect of the metal material component A of the protection film 9 slightly diffused in the surface layer of the organic semiconductor pattern 7a, corrosion caused by the etchant of the organic semiconductor pattern 7a is prevented. That is, the metal material component expresses corrosion prevention action against the etchant. That is, the film quality of the organic semiconductor pattern 7a is maintained, and excellent transistor characteristics are obtained in the thin film transistor 20-1 using the organic semiconductor pattern 7a. Further, since the metal material component A remains slightly in the surface layer of the organic semiconductor pattern 7a, an effect that the effective channel length of the thin film transistor becomes shorter is also expected.

Moreover, by the wet etching performed at the time of forming the source electrode 13s and the drain electrode 13d, the etchant component B in the etchant is slightly diffused in the surface layer of the semiconductor pattern 7a. Therefore, an effect that ohmic contact between the organic semiconductor pattern 7a and the source electrode 13s and the drain electrode 13d is realized by the etchant component B is also expected.

2. Second Embodiment

Figure 4A:
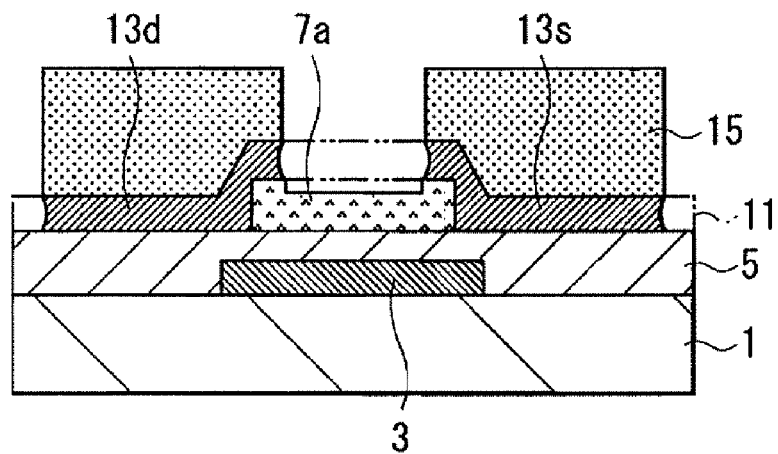
FIGS. 4A and 4B are sectional process drawings for explaining a characteristic part of a second embodiment.
Figure 4B:
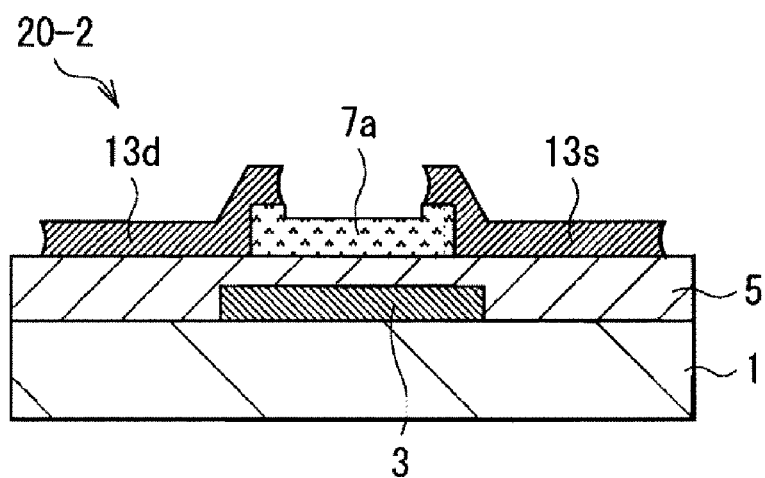

FIGS. 4A and 4B are sectional process drawings expressing a characteristic part of a method of manufacturing a thin film transistor according to a second embodiment. The second embodiment is similar to the first embodiment except that the organic semiconductor pattern 7a is over-etched.

First, by wet-etching the electrode material film 13 using the resist pattern 15 as a mask, the source electrode 13s and the drain electrode 13d are formed. Those processes are similar to those described in the first embodiment with reference to FIGS. 1A to 1D and FIGS. 2A to 2C.

In the embodiment, after that, as shown in FIG. 4A, by over-etching the organic semiconductor pattern 7a exposed from the source electrode 13s and the drain electrode 13d, a process of removing the surface layer of the organic semiconductor pattern 7a is performed. In this case, over-etching of removing the surface layer of the organic semiconductor pattern 7a by dry etching is performed.

After that, the resist pattern 15 is peeled off and removed. The peeling of the resist pattern 15 may be performed in a manner similar to the first embodiment.

By the process, a thin film transistor 20-2 having the top-contact bottom-gate structure shown in FIGS. 4B and 3 is obtained.

Also in the thin film transistor 20-2 obtained in such a manner, an end face of each of the source electrode 13s and the drain electrode 13d isolated from each other above the organic semiconductor pattern 7s has a shape which is isotropically etched by wet etching in a manner similar to the first embodiment. Particularly, the surface layer of the organic semiconductor pattern 7a exposed from the source electrode 13s and the drain electrode 13d is over-etched and has a slightly recessed shape.

Also in the second embodiment, the source electrode 13s and the drain electrode 13d are shaped by etching the electrode material film 13 using the resist pattern 15 as a mask. Consequently, in a manner similar to the first embodiment, while applying the process which is easy and suitable for increase in the area, the thin film transistor 20-2 having the top-contact structure with suppressed deterioration is obtained with high precision without damaging the organic semiconductor pattern 7a.

Particularly, even in the case where the organic semiconductor pattern 7a is damaged at the time of wet etching performed for forming the source electrode 13s and the drain electrode 13d, the surface layer in this part is removed by over-etching. Consequently, occurrence of parasitic transistor or the like is suppressed, and reliability of the device improves.

3. Third Embodiment

FIGS. 5A to 5D are sectional process drawings expressing a characteristic part of a method of manufacturing a thin film transistor according to a third embodiment. The third embodiment is similar to the foregoing embodiments except that the protection film pattern 9a is left on the organic semiconductor pattern 7a.

Figure 5A:
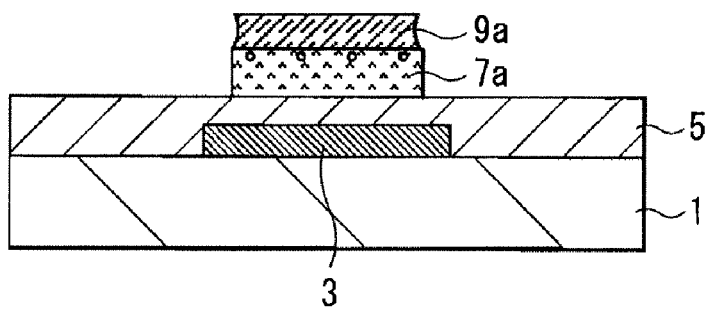
FIGS. 5A to 5D are sectional process drawings for explaining a characteristic part of a third embodiment.

First, as shown in FIG. 5A, by dry-etching the organic semiconductor layer 7 over the protection film pattern 9a made of a metal material, the organic semiconductor pattern 7a is formed. Those processes are performed in a manner similar to those described in the first embodiment with reference to FIGS. 1A to 1D. As the material of the protection film pattern 9a, a material by which a film is formed without damaging the organic semiconductor layer 7 and which comes into ohmic contact with the organic semiconductor layer 7a is selected and used.

In a manner similar to the first embodiment, since the protection film pattern 9a made of the metal material is provided in contact with the organic semiconductor layer 7, the metal material component A of the protection film pattern 9 is slightly diffused in the surface layer of the organic semiconductor layer 7.

Figure 5B:
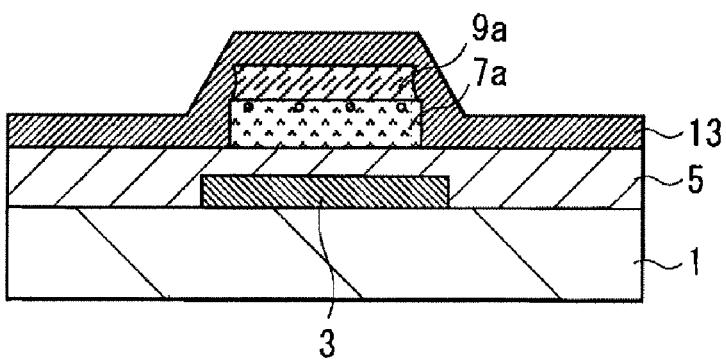

The third embodiment is characterized in that, after that, as shown in FIG. 5B, without removing the protection film pattern 9a, the organic semiconductor pattern 7a and the protection film pattern 9a are covered with the electrode material film 13. The electrode material film 13 is formed in a manner similar to the first embodiment explained with reference to FIG. 2A. The material of the electrode material film 13 may be selected without necessity of considering damage at the time of film formation on the organic semiconductor pattern 7a and ohmic contact with the organic semiconductor pattern 7a. The electrode material film 13 may be made of the same material as that of the protection film pattern 9a or may be made of a different material.

Figure 5C:
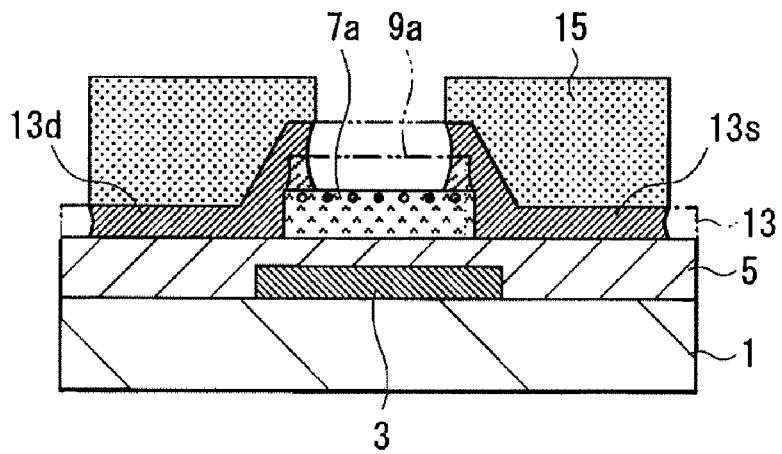

After that, as shown in FIG. 5C, the resist pattern 15 is formed on the electrode material film 13 in a manner similar to the first embodiment.

Next, using the resist pattern 15 as a mask, the electrode material film 13 is etched first. By the etching, the source electrode 13s and the drain electrode 13d are formed, which are isolated from each other above the organic semiconductor pattern 7a and have a shape that an end portion is stacked on the organic semiconductor pattern 7a in positions where they face each other while sandwiching the gate electrode 3.

In the third embodiment, following the etching for the electrode material film 13, the protection film pattern 9a is etched. The protection film pattern 9a made of the metal material is left in parts where the source electrode 13s and the drain electrode 13d are stacked on the organic semiconductor pattern 7a. By the parts where the protection film pattern 9a is left, a part of the source electrode 13s and a part of the drain electrode 13d is made thick.

The electrode material film 13 and the protection film pattern 9a are etched by wet etching. As etchant, an etchant similar to that for the protection film 9 and the electrode material film 13 is used. By an effect of the metal material component A of the protection film 9 slightly diffused into the surface layer of the organic semiconductor pattern 7a, corrosion caused by the etchant for the organic semiconductor pattern 7a is prevented. By the wet etching, the etchant component B in the etchant is slightly diffused in the surface layer of the semiconductor pattern 7a.

After the source electrode 13s and the drain electrode 13d are formed by wet etching, the resist pattern 15 is removed. Removal of the resist pattern 15 is performed in a manner similar to that of the resist pattern 11.

Figure 5D:
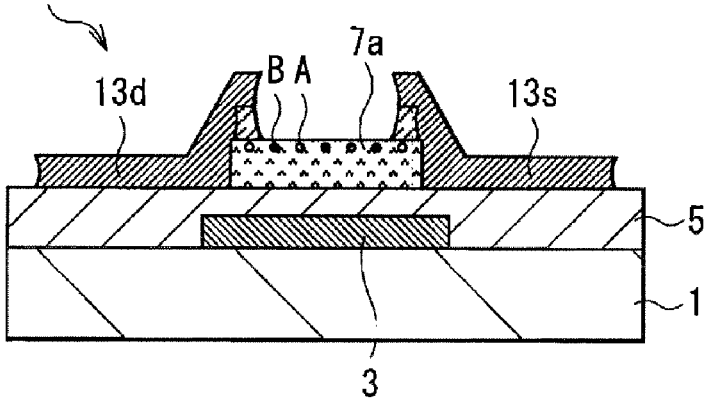

As a result, a thin film transistor 20-3 having the top-contact bottom-gate structure shown in FIGS. 5D and 3 is obtained.

Also in the thin film transistor 20-3 obtained in such a manner, an end face of each of the source electrode 13s and the drain electrode 13d isolated from each other above the organic semiconductor pattern 7a has a shape which is isotropically etched by wet etching. In particular, the parts stacked on the organic semiconductor pattern 7a in the source electrode 13s and the drain electrode 13d in the thin film transistor 20-3 are thickened. The parts are thickened by stacking the part made by the electrode material film 13 on the protection film pattern 9a which is in ohmic contact with the organic semiconductor pattern 7a.

Also in the embodiment, the source electrode 13s and the drain electrode 13d are shaped by etching the electrode material film 13 and the protection film pattern 9a using the resist pattern 15 as a mask. Consequently, in a manner similar to the first embodiment, while applying the process which is easy and suitable for increase in the area, the thin film transistor 20-3 having the top-contact structure with suppressed deterioration is obtained with high precision without damaging the organic semiconductor pattern 7a.

As long as the protection film pattern 9a left on the organic semiconductor pattern 7a is in ohmic contact with the organic semiconductor pattern 7a, the source electrode 13s and the drain electrode 13d part formed by the electrode material film 13 may be selected without considering the ohmic contact. Consequently, as the material of the source electrode 13s and the drain electrode 13d, a cheap material may be used and the cost may be reduced.

Although the source electrode 13s and the drain electrode 13d part stacked on the organic semiconductor pattern 7a is generally formed with small line width, the part is thickened by the protection film pattern 9, so that the structure is reinforced.

In a manner similar to the first embodiment, by the metal material component A of the protection film 9 slightly diffused in the surface layer of the organic semiconductor pattern 7a, corrosion caused by the etchant for the organic semiconductor pattern 7a is prevented, and an effect that the thin film transistor 20-3 obtains excellent characteristics is also expected. Another effect is also expected that because of slight residual of the metal material component A in the surface layer of the organic semiconductor pattern 7a, the effective channel length of the thin film transistor becomes shorter.

Further, by the wet etching at the time of forming the source electrode 13s and the drain electrode 13d, the etchant component B in the etchant is slightly diffused in the surface layer of the semiconductor pattern 7a. Consequently, in a manner similar to the first embodiment, an effect is expected that ohmic contact between the organic semiconductor pattern 7a and the source electrode 13s and the drain electrode 13d is realized by the etchant component B.

In the third embodiment, after the source electrode 13s and the drain electrode 13d are formed in the process of FIG. 5C, as described in the second embodiment, the surface layer exposed in the organic semiconductor pattern 7s may be over-etched. Therefore, even in the case where the organic semiconductor pattern 7a is damaged at the time of wet etching performed for forming the source electrode 13s and the drain electrode 13d, the surface layer in this part is removed by over-etching. Consequently, occurrence of parasitic transistor or the like is suppressed, and reliability of the device improves.

4. Fourth Embodiment

FIGS. 6A to 6D and FIGS. 7A to 7C are sectional process drawings expressing a characteristic part of a method of manufacturing a thin film transistor according to a fourth embodiment. The fourth embodiment is similar to the foregoing embodiments except that a carrier injection material is used for a protection film and a protection film pattern and is left.

Figure 6A:
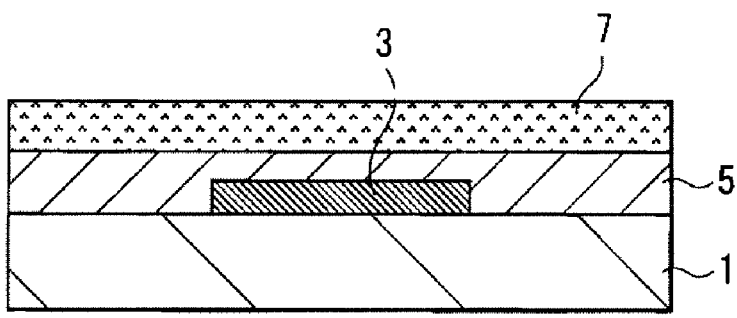
FIGS. 6A to 6D are sectional process drawings (No. 1) for explaining a fourth embodiment.

First, as shown in FIG. 6A, the gate electrode 3 is formed in a pattern on the insulating substrate 1, the gate insulating film 5 is formed so as to cover the gate electrode 3 and, further, the organic semiconductor layer 7 is formed on the gate insulating film 5. Those processes are similar to those described in the first embodiment with reference to FIG. 1A and are performed by a normal procedure.

Figure 6B:
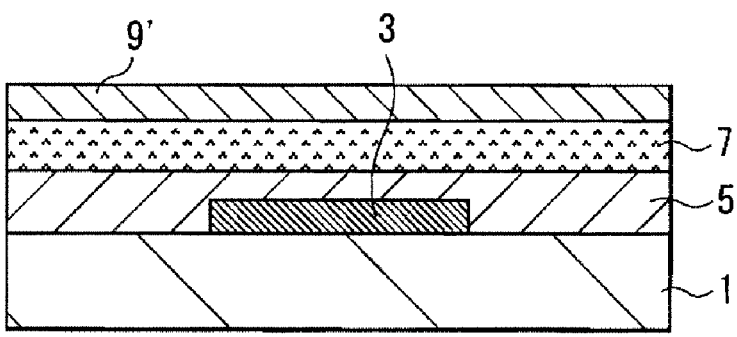

As shown in FIG. 6B, a protection film 9' made of the carrier injection material is formed on the organic semiconductor layer 7. As the carrier injection material, for example, when a thin film transistor to be formed is of the p-channel type, an organic material of a hole injection type may be used. Examples of the material include poly(3,4-ethylenedioxythiophene)/poly(4-styrenesulphonate) (PEDOT/PSS), tetrathiofulvalene/tetracyanoquinodimethane) (TTF/TCNQ), tetrafluoro-tetracyanoquinodimethane (F4 TCNQ).

The protection film 9' may be formed by applying a method properly selected from the vacuum deposition methods such as resistance heating evaporation and sputtering and the above-described various methods in accordance with a material to be used.

Figure 6C:
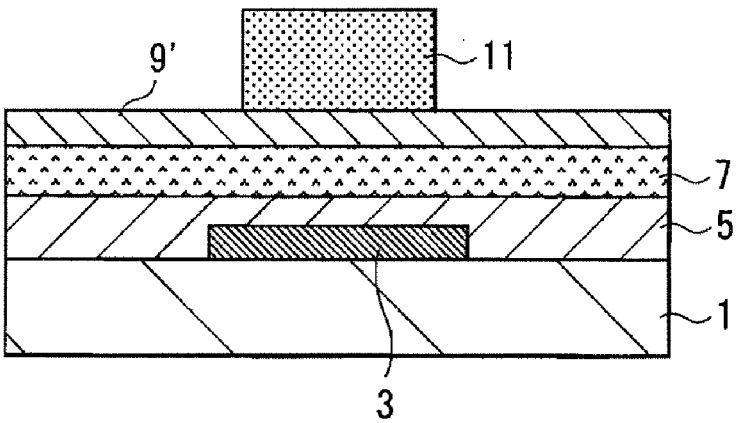

Next, as shown in FIG. 6C, the resist pattern 11 is formed in a manner similar to the first embodiment on the protection film 9' in a position where it overlays the gate electrode 3.

Figure 6D:
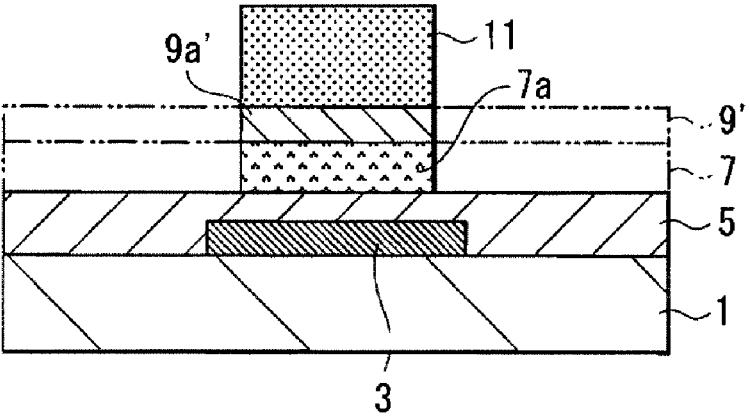

As shown in FIG. 6D, using the resist pattern 11 as a mask, the protection film 9' and the organic semiconductor layer 7 are etched. In this case, the protection film 9' and the organic semiconductor layer 7 are continuously etched by dry etching, thereby forming a protection film pattern 9a' made of the carrier injection material. By the process, the organic semiconductor pattern 7a is formed in a pattern so as to cover a part of the gate electrode 3 in the width direction of the gate electrode 3, and the thin film transistor is isolated. After completion of etching, the resist pattern 11 is removed.

The protection film 9' may be etched by wet etching. In this case, as an etchant, an orthogonal solvent for the organic semiconductor layer, like alcohol such as ethanol or water is used.

Figure 7A:
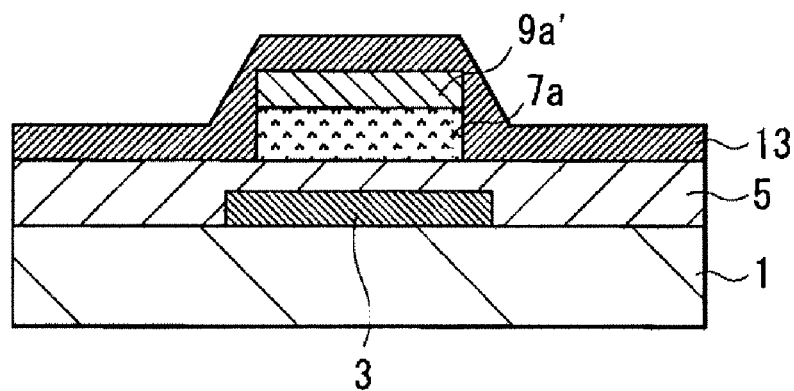
FIGS. 7A to 7C are sectional process drawings (No. 2) for explaining the fourth embodiment.

As shown in FIG. 7A, without removing the protection film pattern 9a', the organic semiconductor pattern 7a and the protection film pattern 9a' are covered with the electrode material film 13. The electrode material film 13 may be formed in a manner similar to the first embodiment described with reference to FIG. 2A. The electrode material film 13 is made of a material which is in ohmic contact with the protection film pattern 9'. As such a material, from the viewpoint of ohmic contact with the protection film pattern 9', gold (Au), platinum (Pt), silver (Ag), copper (Cu), aluminum (Al), nickel (Ni), chromium (Cr), molybdenum (Mo), alloys and oxides of those elements, and the like are preferably used.

Figure 7B:
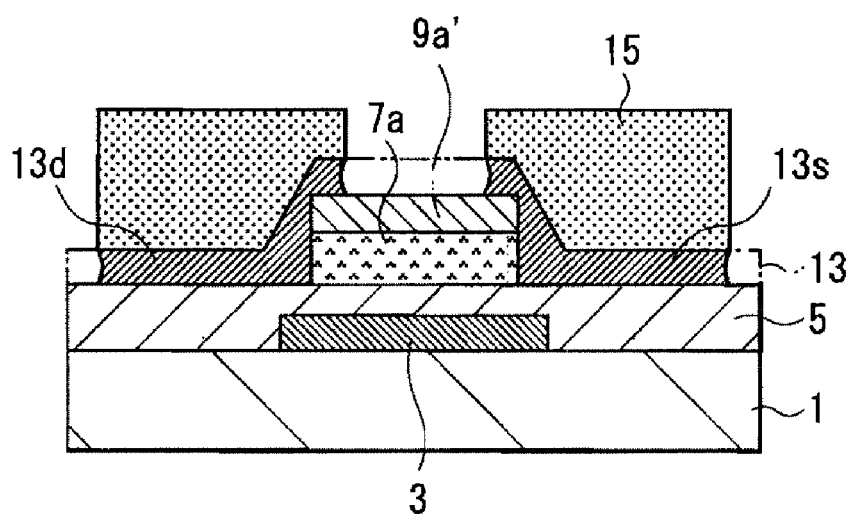

After that, as shown in FIG. 7B, the resist pattern 15 is formed on the electrode material film 13 in a manner similar to the first embodiment. Further, using the resist pattern 15 as a mask, the electrode material film 13 is etched. By the operation, the source electrode 13s and the drain electrode 13d are formed in a shape that an end portion is stacked on the organic semiconductor pattern 7a in positions where the electrodes face each other while sandwiching the gate electrode 3.

As the etching for the electrode material film 13, wet etching is employed in a manner similar to the first embodiment. In the wet etching, by the protection film pattern 9a', the organic semiconductor pattern 7a is not corroded by an etchant. Thus, reliability of the TFT is assured.

After the source electrode 13s and the drain electrode 13d are formed by wet etching, the resist pattern 15 is removed in a manner similar to the first embodiment.

Figure 7C:
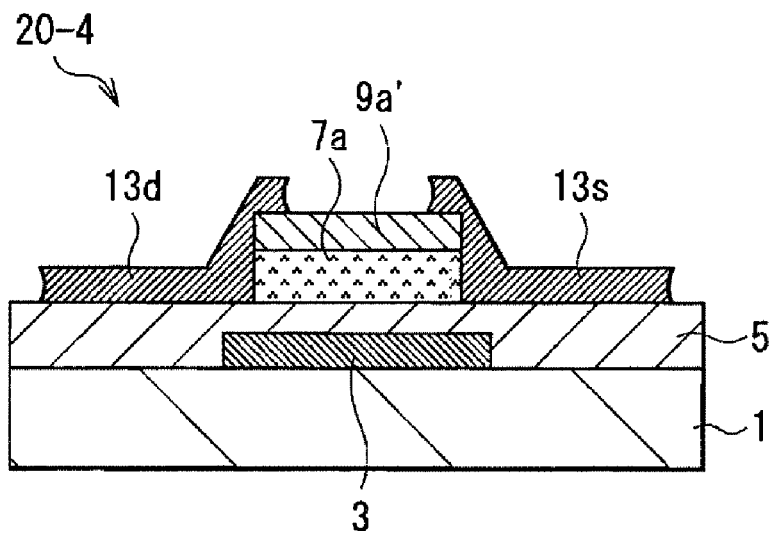

As a result, a thin film transistor 20-4 having the top-contact bottom-gate structure shown in FIGS. 7C and 3 is obtained.

In the thin film transistor 20-4 obtained in such a manner, an end face of each of the source electrode 13s and the drain electrode 13d isolated from each other above the organic semiconductor pattern 7a has a shape which is isotropically etched by wet etching. In particular, the thin film transistor 20-4 is obtained by stacking the protection film pattern 9a' made of the carrier injection organic material on the organic semiconductor pattern 7a. The protection film pattern 9a' is sandwiched between the organic semiconductor pattern 7a and the source electrode 13s and the drain electrode 13d.

Also in the fourth embodiment, the source electrode 13s and the drain electrode 13d are shaped by etching the electrode material film 13 using the resist pattern 15 as a mask. Consequently, in a manner similar to the first embodiment, while applying a process which is easy and also suitable to increase the area, the thin film transistor 20-4 having the top-contact structure with suppressed deterioration is obtained with high precision without damaging the organic semiconductor pattern 7a.

In particular, since the source electrode 13s and the drain electrode 13d are disposed via the protection film pattern 9a' made of the carrier injection organic material on the organic semiconductor pattern 7a, the organic semiconductor pattern 7a is protected with the protection film pattern 9a'. With the configuration, the film quality of the organic semiconductor pattern 7a is maintained excellently, and excellent transistor characteristics are obtained in the thin film transistor 20-4 using the organic semiconductor pattern 7a.

Further, since formation of the electrode material film 13 does not exert influence on the organic semiconductor pattern 7a, the option of the electrode material film 13 enlarges, and cost may be reduced using a cheaper material.

5. Fifth Embodiment

FIGS. 8A to 8D and FIGS. 9A to 9C are sectional process drawings expressing a characteristic part of a method of manufacturing a thin film transistor according to a fifth embodiment. The fifth embodiment is similar to the foregoing embodiments except that a protection film pattern having a stacked structure is left.

Figure 8A:
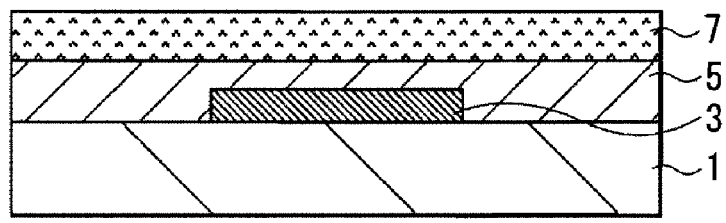
FIGS. 8A to 8D are sectional process drawings (No. 1) for explaining a fifth embodiment.

First, as shown in FIG. 8A, the gate electrode 3 is formed in a pattern on the insulating substrate 1, the gate insulating film 5 is formed so as to cover the gate electrode 3 and, further, the organic semiconductor layer 7 is formed on the gate insulating film 5. Those processes are similar to those described in the first embodiment with reference to FIG. 1A and are performed by a normal procedure.

Figure 8B:
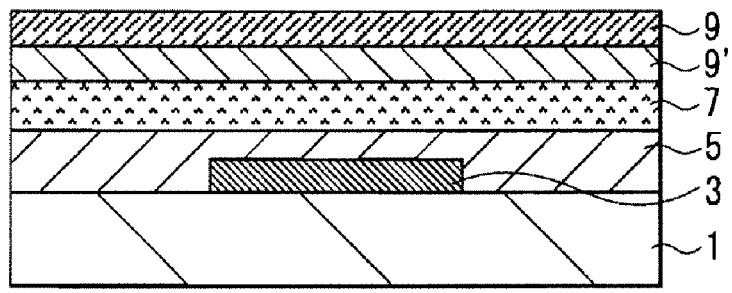

As shown in FIG. 8B, a first protection film 9' made of the carrier injection material is formed on the organic semiconductor layer 7 and, further, a second protection film 9 made of a metal material is formed. The first protection film 9' made of the carrier injection material is formed in a manner similar to the protection film 9' made of the carrier injection material described in the process of FIG. 6A of the fourth embodiment. The second protection film 9 made of the metal material is formed in a manner similar to the protection film made of the metal material described with reference to FIG. 1B in the first embodiment. For the second protection film 9 made of the metal material, a material which is ohmic contact with a first protection film pattern 9a-1 made of the carrier injection material is selectively used.

Figure 8C:
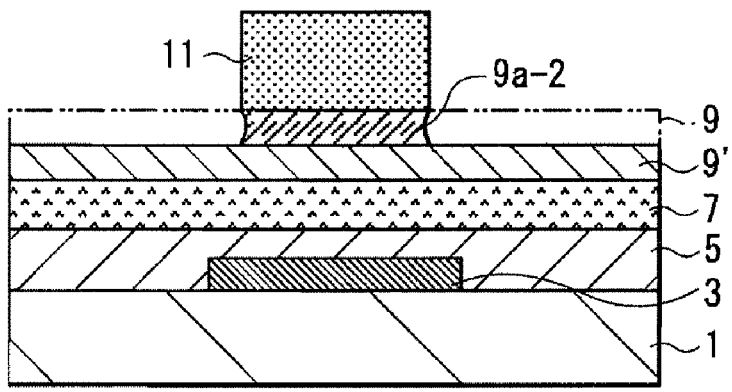

Next, as shown in FIG. 8C, the resist pattern 11 is formed in a manner similar to the first embodiment on the second protection film 9 in a position where it overlaps the gate electrode 3 and, subsequently, the second protection film 9 is etched using the resist pattern 11 as a mask. The second protection film 9 made of the metal material is etched by wet etching in a manner similar to the first embodiment.

Figure 8D:
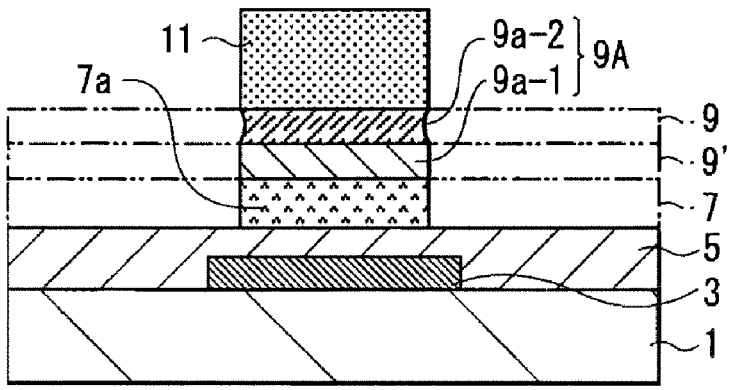

Subsequently, as illustrated in FIG. 8D, the first protection film 9' is etched. By the process, a protection film pattern 9A obtained by stacking a first protection film pattern 9a-1 made of the carrier injection material and a second protection film pattern 9a-2 made of a metal material in order on the organic semiconductor layer 7 is formed. The first protection film 9' made of the carrier injection material is etched by dry etching in a manner similar to the fourth embodiment.

Subsequent to the etching of the first protection film 9', the organic semiconductor layer 7a is etched, and the organic semiconductor pattern 7a is formed in a state where a part of the gate electrode 3 is covered in the width direction of the gate electrode 3. The organic semiconductor layer 7a is etched by the same process as the dry etching of the first protection film 9', thereby isolating a thin film transistor to be formed. After completion of the etching, the resist pattern 11 is removed. Etching of the first protection film 9' made of the carrier injection material may be wet etching. In this case, as an etchant, an orthogonal solvent for the organic semiconductor layer, like alcohol such as ethanol or water is used.

Figure 9A:
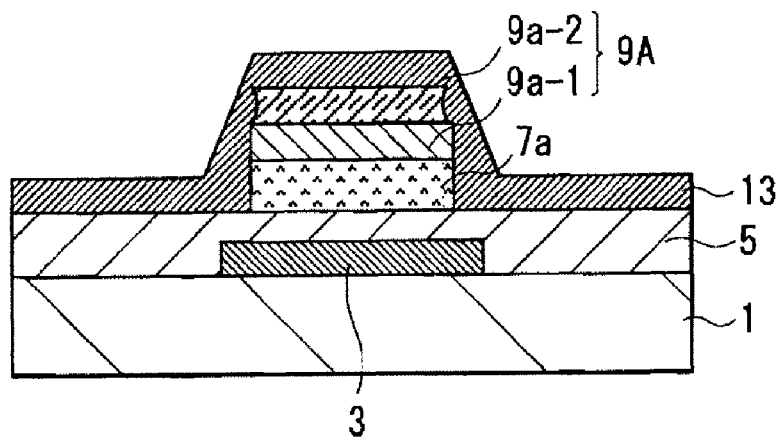
FIGS. 9A to 9C are sectional process drawings (No. 2) for explaining the fifth embodiment.

Subsequently, as shown in FIG. 9A, the protection film pattern 9A is covered with the electrode material film 13. The electrode material film 13 is formed in a manner similar to the first embodiment described with reference to FIG. 2A.

Figure 9B:
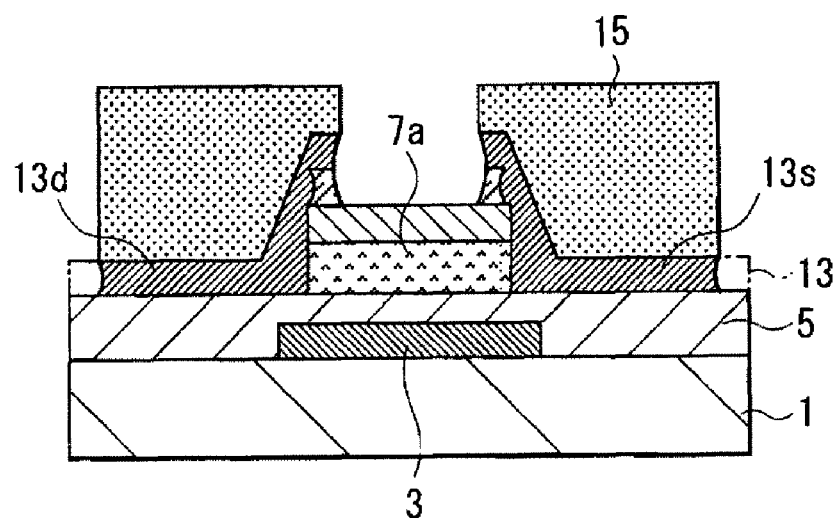

After that, as shown in FIG. 9B, the resist pattern 15 is formed on the electrode material film 13 in a manner similar to the first embodiment. Further, using the resist pattern 15 as a mask, the electrode material film 13 is etched. By the operation, the source electrode 13s and the drain electrode 13d are formed in a shape that an end portion is stacked on the organic semiconductor pattern 7a in positions where the electrodes face each other while sandwiching the gate electrode 3.

Subsequent to the etching for the electrode material film 13, the second protection film pattern 9a-2 made of a metal material is etched. As a result, the second protection film pattern 9a-2 made of a metal material is left in parts in which the source electrode 13s and the drain electrode 13d are stacked on the organic semiconductor pattern 7a. By the left part of the second protection film pattern 9a-2, a part of the source electrode 13s and the drain electrode 13d is thickened.

The electrode material film 13 and the second protection film pattern 9a-2 made of a metal material are etched by wet etching. As an etchant, an etchant similar to that used in the etching of the protection film 9 and the electrode material film 13 is used.

After the source electrode 13s and the drain electrode 13d are formed by wet etching, the resist pattern 15 is removed. The resist pattern 15 is removed in a manner similar to the above-described removal of the resist pattern 11.

Figure 9C:
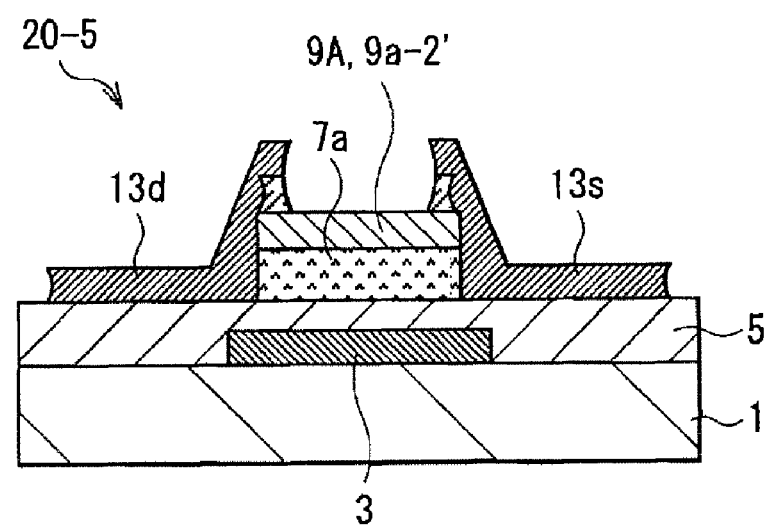

As a result, a thin film transistor 20-5 having the top-contact bottom-gate structure shown in FIGS. 9C and 3 is obtained.

In the thin film transistor 20-5 obtained in such a manner, an end face of each of the source electrode 13s and the drain electrode 13d isolated from each other above the organic semiconductor pattern 7a has a shape which is isotropically etched by wet etching like in the first embodiment. In particular, in a manner similar to the fourth embodiment, the thin film transistor 20-5 is obtained by stacking the first protection film pattern 9a-1 made of the carrier injection organic material on the organic semiconductor pattern 7a. In a manner similar to the third embodiment, a part stacked on the organic semiconductor pattern 7a in the source electrode 13s and the drain electrode 13d is thickened by the second protection film pattern 9a-2 made of the metal material.

Also in the fifth embodiment, the source electrode 13s and the drain electrode 13d are shaped by etching the electrode material film 13 using the resist pattern 15 as a mask. Consequently, in a manner similar to the first embodiment, while applying a process which is easy and also suitable to increase the area, the thin film transistor 20-4 having the top-contact structure with suppressed deterioration is obtained with high precision without damaging the organic semiconductor pattern 7a.

In addition, in a manner similar to the fourth embodiment, the film quality of the organic semiconductor pattern 7a is maintained excellently by being protected by the first protection film pattern 9a-1 made of the carrier injection material, and excellent transistor characteristics are obtained in the thin film transistor 20-4 using the organic semiconductor pattern 7a. Further, since formation of the electrode material film 13 and the second protection film 9 made of the metal material does not exert influence on the organic semiconductor pattern 7a, the option of the electrode material film 13 enlarges, and cost may be reduced using a cheaper material.

In a manner similar to the third embodiment, as long as the second protection film pattern 9a-2 made of a metal material is in ohmic contact with the first protection film pattern 9a-1 made of a carrier injection material, the source electrode 13s and the drain electrode 13d part formed by the electrode material film 13 may be selected without considering the ohmic contact. Consequently, as the material of the source electrode 13s and the drain electrode 13d, a cheap material may be used and the cost may be reduced.

Although the source electrode 13s and the drain electrode 13d part stacked on the organic semiconductor pattern 7a is generally formed with small line width, the part is thickened by the second protection film pattern 9a-2, so that the structure is reinforced.

In the foregoing first to fifth embodiments, the configuration of forming the organic semiconductor pattern 7a by formation of an organic semiconductor layer and patterning of the formed organic semiconductor layer has been described. However, the formation of the semiconductor pattern 7a is not limited to the procedure but may be the following methods. For example, patterning by vapor deposition using a metal mask, patterning using a print shadow mask, patterning by liftoff process, further, patterning to which a printing method such as ink jet printing, reverse offset printing, or microcontact printing is applied, and the like may be applied.

Further, also to formation of the semiconductor pattern 7a and the protection film pattern 9a' made of the carrier injection material described with reference to FIGS. 6A to 6D in the fourth embodiment, patterning by vapor deposition using a metal mask, patterning using a print shadow mask, patterning by liftoff process, further, patterning to which a printing method such as ink jet printing, reverse offset printing, or microcontact printing is applied, and the like may be applied.

In the foregoing first to fifth embodiments, the thin film transistor of the top contact type using organic semiconductor as a channel is stably realized. In application fields requiring high mobility, the contact resistance between the organic semiconductor layer and the source-drain electrode has to be reduced further. This is because, even when semiconductor of high mobility is used, if the contact resistance is high, mobility of an entire device is limited. One of methods of reducing contact resistance is a method of increasing carrier injection efficiency by controlling the work function of the electrode material by electrode modification or the like. It is however difficult to introduce such a technique in the organic thin film transistor of the top contact type. In the following embodiment, the method of increasing carrier mobility by reducing the contact resistance between the organic semiconductor layer and the source and drain electrode will be described.

6. Sixth Embodiment

FIGS. 10A to 10D are sectional process drawings expressing a characteristic part of a method of manufacturing a thin film transistor according to a sixth embodiment. Since the processes of the sixth embodiment are the same as those of the first embodiment up to the process of FIG. 2A, the subsequent processes will be described.

Figure 10A:
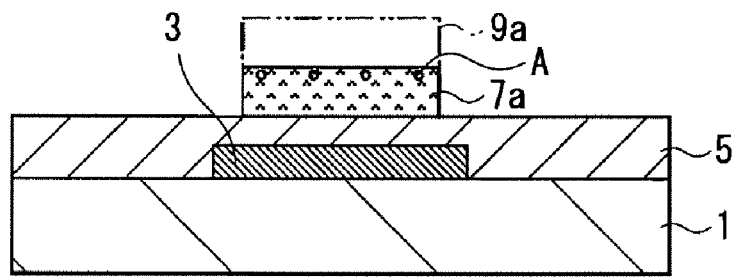
FIGS. 10A to 10D are sectional process drawings for explaining a sixth embodiment.
Figure 10B:
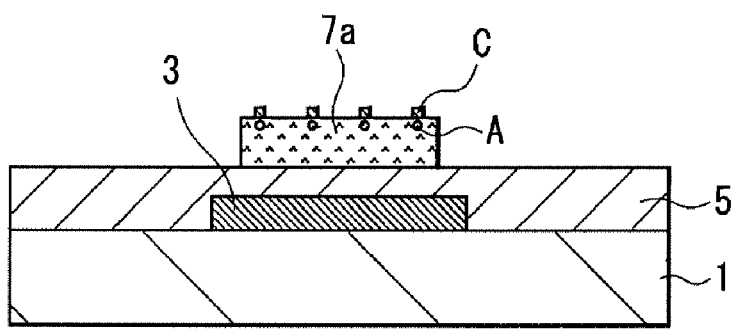

After the protection film pattern 9a is peeled off in the process of FIG. 10A (FIG. 2A), as shown in FIG. 10B, a surface process is performed with a surface treatment agent on the surface of the organic semiconductor pattern 7a. The surface treatment agent contains molecules which chemically react with the metal material such as gold (Au) remaining in the surface layer of the organic semiconductor pattern 7a. Concrete examples of the molecule include organosulfur molecules of thiols, disulfides, and the like, organic selenium/tellurium molecules, nitrile compound, organic silane compound, carboxylic acids, phosphonic acids, phosphoesters, unsaturated hydrocarbons, alcohol aldehyde, halide, diazo compound, and the like. The surface treatment may be performed in a gas phase or in a solution.

In the embodiment, for example, pentafluorobenzenethiol is used as the surface treatment agent. In vapor of pentafluorozenzenethiol, reaction between gold (Au) A remaining in the surface layer of the organic semiconductor pattern 7a and a thiol molecule C is made. By the reaction, the gold molecule A and the thiol molecule C are chemically combined, and contact resistance between the source electrode 13s and the drain electrode 13d formed by the same Au later and the organic semiconductor pattern 7a is reduced. Although the thiol molecules C are dispersed in this case, they may be formed in a layer state on the surface of the organic semiconductor pattern 7a. In any of the cases, it is desirable to eliminate the thiol molecules C in the region between the source electrode 13s and the drain electrode 13d to be formed later simultaneously with Au remaining in the surface layer of the organic semiconductor pattern 7a by over-etching similar to that in the second embodiment. By the process, occurrence of a parasitic transistor or the like is suppressed and reliability of the device improves.

Figure 10C:
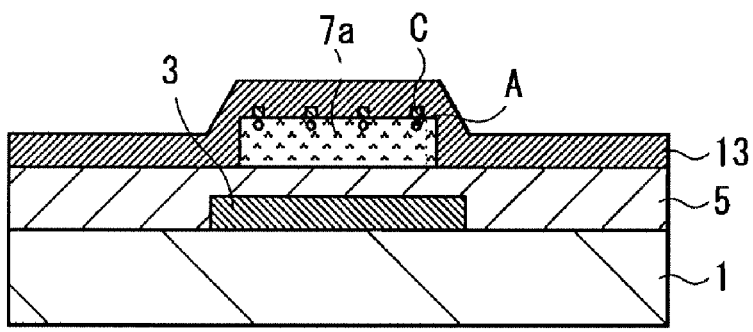

Subsequently, as shown in FIG. 10C, the electrode material film 13 made of, for example, Au is formed on the gate insulating film 5 so as to cover the organic semiconductor pattern 7a. Since the process is similar to that of FIG. 2B, the details will not be repeated.

Figure 10D:
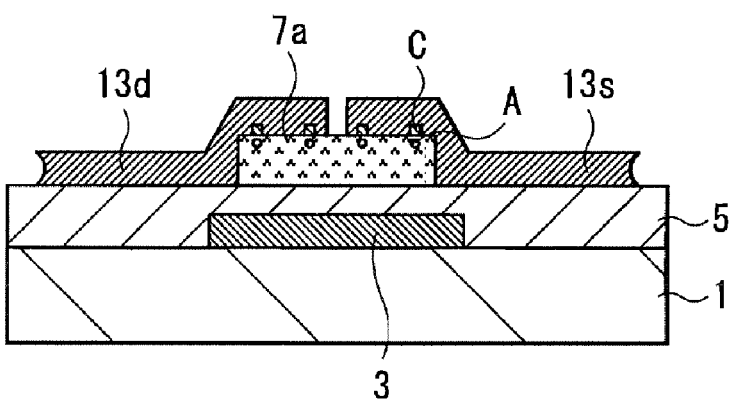

Next, as shown in FIG. 10D, a resist pattern (not shown) is formed on the electrode material film 13 and, using the resist pattern as a mask, the electrode material film 13 is etched. By the etching, the source electrode 13s and the drain electrode 13d are formed. After that, the resist pattern is removed.

In the embodiment as described above, prior to formation of the source electrode 13s and the drain electrode 13d, the surface of the organic semiconductor pattern 7a is subjected to surface treatment with tetrafluorobenzenethiol to make reaction between Au residing in the surface of the organic semiconductor pattern 7a and tetrafluorobenzenethiol. As a result, contact resistance between the organic semiconductor pattern 7a and each of the source electrode 13s and the drain electrode 13d is reduced, and the carrier mobility may be increased. Therefore, to the fields requiring high mobility, an organic thin film transistor of the top contact type is applied. The other effects are similar to those of the first embodiment.

Figure 11:
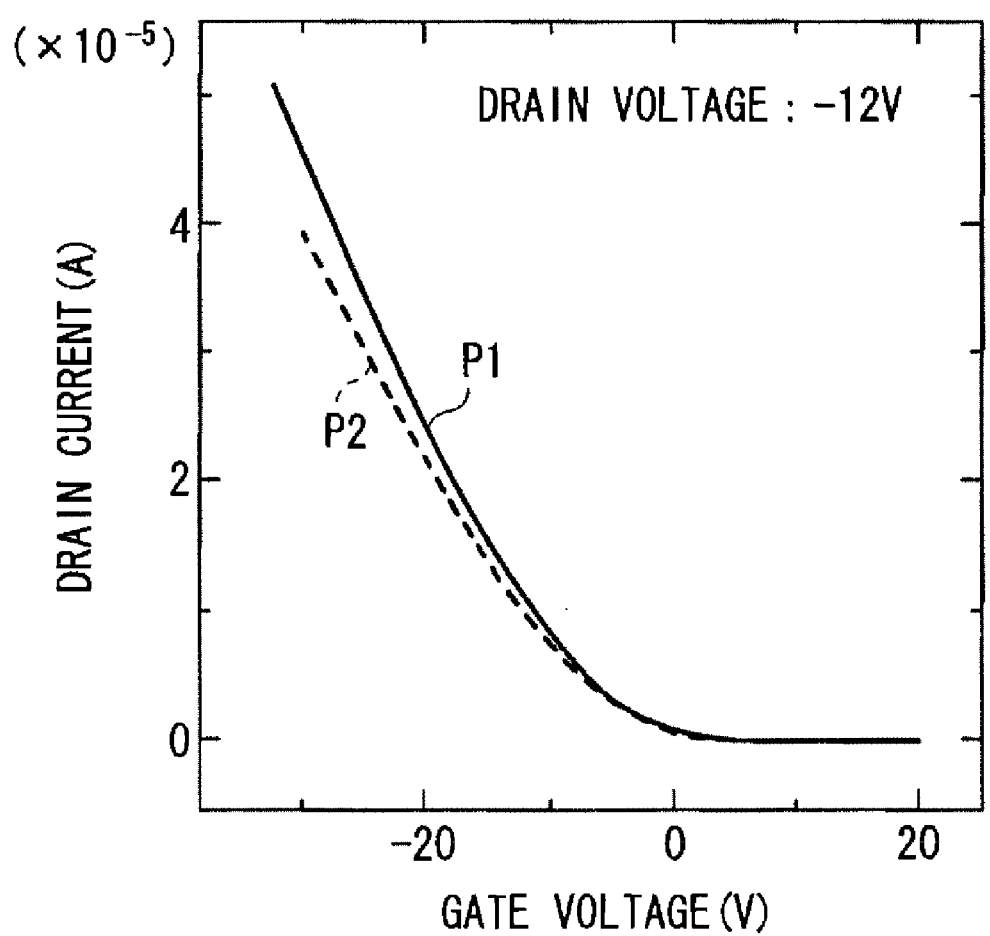
FIG. 11 is a characteristic diagram for explaining an effect of the sixth embodiment.

FIG. 11 illustrates the relation between gate voltage (V) and drain current (A) in the case where the drain voltage is set to −12V, of each of a thin film transistor (example 1) subjected to the surface treatment by the embodiment and a thin film transistor (comparative example) obtained without the surface treatment. The parameters are the same except for the presence or absence of the surface treatment. In the diagram, P1 illustrates the example 1, and P2 illustrates the comparative example. The contact resistance of the comparative example is 6.8 kΩ·cm and, in contrast, that of the example 1 is 2.7 kΩ·cm. It is understood that the contact resistance is largely reduced as compared with that of the comparative example.

7. Seventh Embodiment

FIGS. 12A to 12D are sectional process drawings expressing a characteristic part of a method of manufacturing a thin film transistor according to a seventh embodiment. In the seventh embodiment, an organic complex pattern as a carrier injection layer is interposed between the organic semiconductor pattern 7a and each of the source electrode 13s and the drain electrode 13d. Since the processes of the seventh embodiment are also the same as those of the first embodiment up to the process of FIG. 2A, the subsequent processes will be described.

Figure 12A:
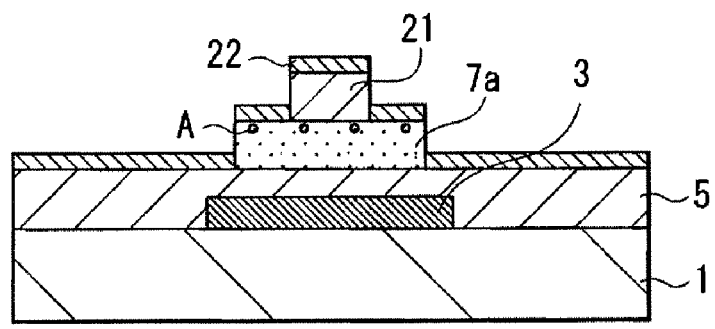
FIGS. 12A to 12D are sectional process drawings for explaining a seventh embodiment.

After the protection film pattern 9a is peeled off by, for example, wet etching in the process of FIG. 2A, as shown in FIG. 12A, a mask 21 made of metal is formed on the organic semiconductor pattern 7a by photolithography or printing. As the mask 21, the protection film pattern 9a may not be peeled off but may be patterned by being partially etched and used. Next, an organic charge-transfer complex is formed on the gate insulating film 5 so as to cover the organic semiconductor pattern 7a and the mask 21, thereby forming an organic charge-transfer complex film 22.

The organic charge-transfer complex may be a charge-transfer complex of an organic donor and an organic acceptor such as TTF-TCNQ, or a charge-transfer complex of an organic molecule and an inorganic ion compound (pentacene-metal oxide). As a method of forming the organic charge-transfer complex, vacuum deposition of a complex or co-deposition of a donor and an acceptor may be mentioned. Alternatively, any of the above-described various printing methods may be used.

In this case, the organic charge-transfer complex has a composition of (D: donor) x-(A: acceptor) y. Examples of the donor molecule include polypyrrole and polypyrrole substitute, polythiophene and polythiophene substitute, isothianaphthenes such as polyisothianaphthene, chenylene vinylenes such as polychenylene vinylene, poly(p-phenylenevinylenes) such as poly(p-phenylenevinylene), polyaniline and polyaniline substitute, polyacetylenes, polydiacetylenes, polyazulenes, polypyrenes, polycarbazoles, polyselenophenes, polyfurans, poly(p-phenylenes), polyindoles, polypyridazines, polymers and polycyclic condensate such as polyvinyl carbazole, polyphenylene sulfide, or polyvinylene sulfide, derivatives (triphenodioxazine, triphenodithiazine, hexacene-6, 15-quinone, or the like) obtained by substituting oligomers having the same repeating unit as that of the polymer in the material, acenes such as naphthacene, pentacene, hexacene, dibenzopentacene, tetrabenzopentacene, pyrene, dizenzopyrene, chrysene, perylene, coronene, terrylene, ovalene, quaterrylene, and circumanthracene, and a part of carbon in the acenes with a functional group such as atoms of N, S, O, or the like, a carbonyl group, or the like, metal phthalocyanines, tetrathiafulvalene and tetrathiafulvalene derivatives, tetrathiapentalene and tetrathiapentalene derivatives, and pigment alkaline metal ions, alkaline-earth metal ions, transition metal ions, and the like of merocyanine dyes, hemicyanine dyes, and the like.

Examples of the acceptor molecule include a benzene diquinone derivative such as DDQ or chloranil and its analog, a cyanoquinodimethane derivative such as DCNQI or TCNQ and its analog, a metal complex such as M(mnt)2 or M(dmit)2 (where M denotes metal atom), naphthalene 1,4,5,8-tetracarboxylic acid diimide, N,N'-bis(4-trifuoromethyl benzyl) naphthalene 1,4,5,8-tetracarboxylic acid diimide, N,N'-bis (1H, 1H-perfluorooctyl), N,N'-bis(1H, 1H-perfluorooctyl), and N,N'-dioctylnaphthalene 1,4,5,8-tetracarboxylic acid diimide derivative, naphthalene tetracarboxylic acid diimides such as naphthalene 2,3,6,7 tetracarboxylic acid diimide, condensed-ring tetracarboxylic acid diimides such as anthracene tetracarboxylic acid diimides like anthracene 2,3, 6,7-tetracarboxylic acid diimide, fullerenes such as C60, C70, C76, C78, and C84, carbon nanotube such as SWNT and their derivatives, halogens, metal halide, metal oxide, sulfuric acid, nitric acid, inorganic anion such as perchloric acid.

Figure 12B:
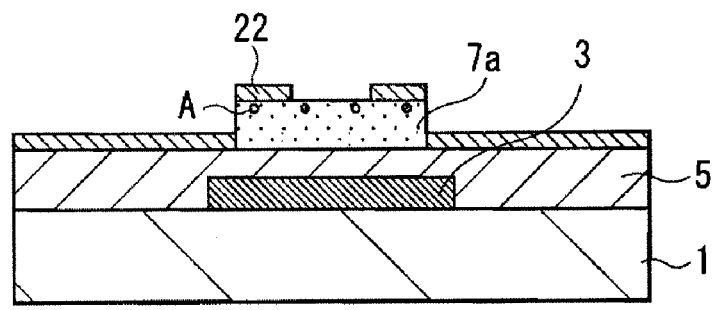
Figure 12C:
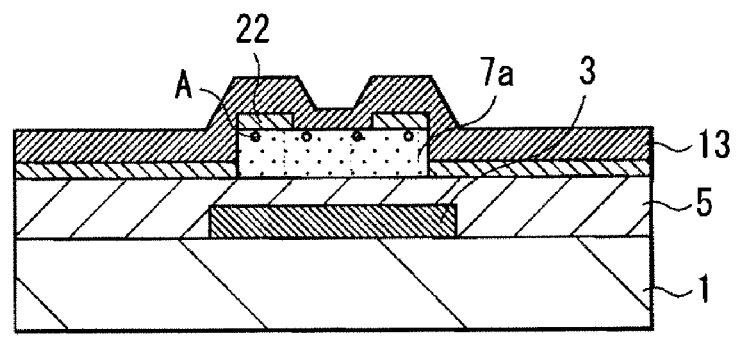

After formation of the organic charge-transfer complex film 22, by peeling off the mask 21 as shown in FIG. 12B, the pattern of the organic charge-transfer complex film 22 is formed. Next, as illustrated in FIG. 12C, in a state where the organic semiconductor pattern 7a and the pattern of the organic charge-transfer complex film 22, the electrode material film 13 made of, for example, Au is formed on the gate insulating film 5. Since the process is similar to that of FIG. 2B, its details will not be described.

Figure 12D:
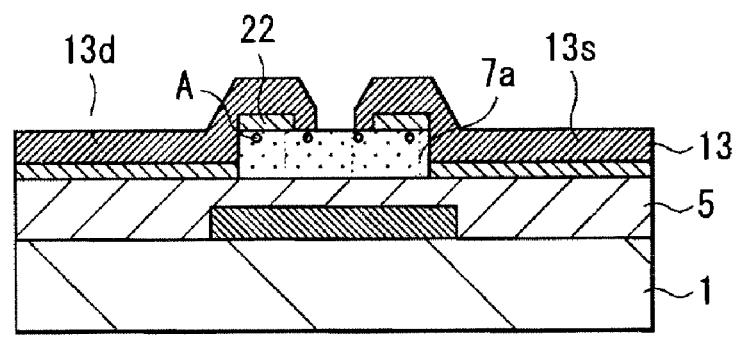

Next, as shown in FIG. 12D, a resist pattern (not shown) is formed on the electrode material film 13 and, by etching the electrode material film 13 using the resist pattern as a mask, the source electrode 13s and the drain electrode 13d are formed. After that, the resist pattern is removed.

In the embodiment as described above, prior to formation of the source electrode 13s and the drain electrode 13d, the pattern of the organic charge-transfer complex film 22 is formed on the surface of the organic semiconductor pattern 7a. Therefore, the organic charge-transfer complex film 22 functions as the carrier injection layer between the organic semiconductor pattern 7a and each of the source electrode 13s and the drain electrode 13d. The contact resistance between the organic semiconductor pattern 7a and each of the source electrode 13s and the drain electrode 13d is reduced, and the carrier mobility may be increased. Therefore, also in the embodiment, to the fields requesting high mobility, the organic thin film transistor of the top contact type is applied. The other effects are similar to those of the first embodiment.

The area ratio between the source electrode 13s and the drain electrode 13d and the organic charge-transfer complex film 22 on the organic semiconductor pattern 7a is not limited. The entire organic charge-transfer complex film 22 may be hidden below each of the electrodes or a part of the organic charge-transfer complex film 22 may be out of each of the electrodes. The organic complex below the source electrode 13s and that below the drain electrode 13d are not in contact with each other.

8. Eighth Embodiment

Figure 13A:
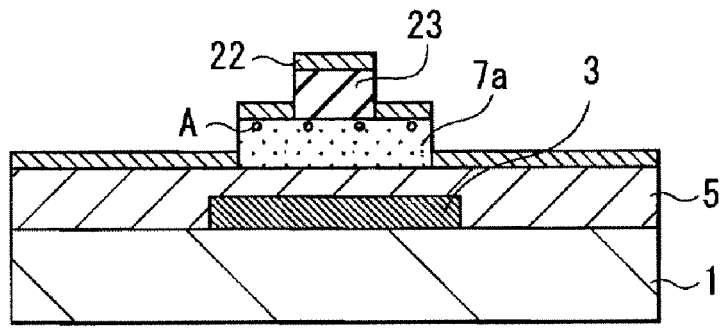
FIGS. 13A to 13C are sectional process drawings for explaining an eighth embodiment.
Figure 13B:
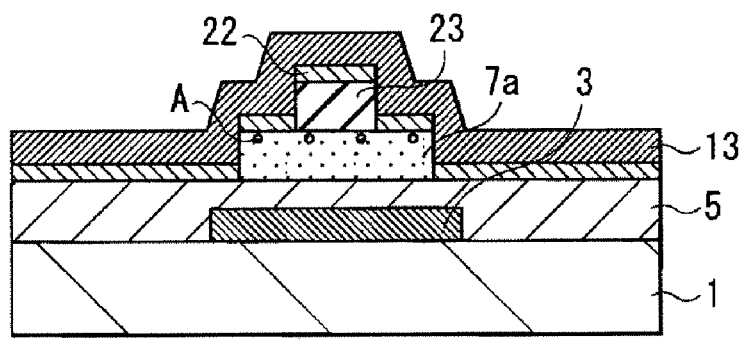
Figure 13C:
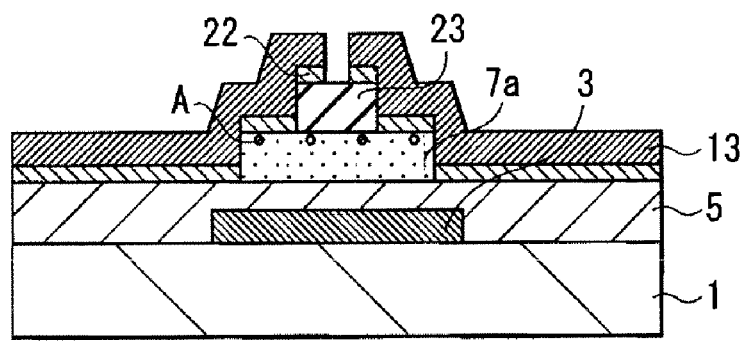

FIGS. 13A to 13C are sectional process drawings expressing a characteristic part of a method of manufacturing a thin film transistor according to an eighth embodiment. In the seventh embodiment, the pattern of the organic charge-transfer complex film 22 is formed by using the mask 21 made of a metal. In the eighth embodiment, as shown in FIGS. 13A and 13B, at the time of forming the organic charge-transfer complex film 22, an insulating mask 23 made of, for example, $SiO_2$ is used. By using the insulating mask 23, the mask 23 is left in the structure (FIG. 13C), so that the manufacturing process is simplified. Since the rest is the same as the seventh embodiment, the description will not be repeated.

9. Application Examples

As an example of an electronic device using the thin film transistor of the invention described in the foregoing embodiments, a display device of an active matrix type using an organic electroluminescence element EL will be described.

Figure 14:
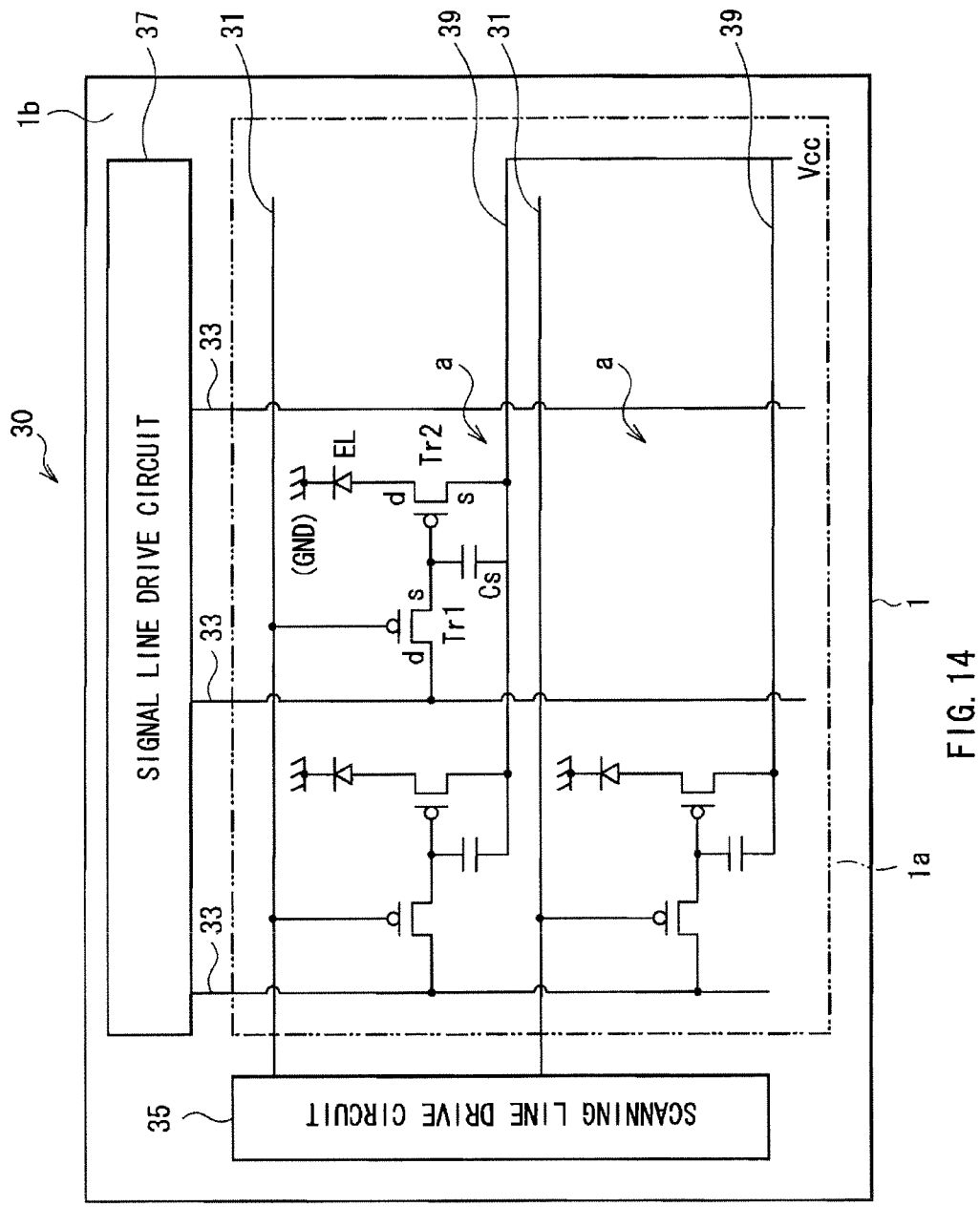
FIG. 14 is a circuit diagram expressing an example of application to a display device.

FIG. 14 is a circuit configuration diagram of a display device (electronic device) 30. On the substrate 1 of a display device 30, a display region 1a and a peripheral region 1b are set. In the display region 1a, a plurality of scanning lines 31 are disposed laterally and a plurality of signal lines 33 are disposed vertically. The display region 1a is constructed as a pixel array in which one pixel "a" is provided in correspondence with each of intersection points of the scan lines 31 and the signal lines 33. In the peripheral region 1b, a scanning line drive circuit 35 for driving the scanning lines 31 and a signal line drive circuit 37 for supplying a video signal (that is, input signal) according to brightness information to the signal lines 33 are disposed.

A pixel circuit provided at each of the intersecting points of the scanning lines 31 and the signal lines 33 is constructed by, for example, a thin film transistor Tr1 for switching, a thin film transistor Tr2 for driving, a retention capacitor Cs, and an organic electroluminescence element EL. As the thin film transistors Tr1 and Tr2, any of the thin film transistors 20-1 to 20-5 is used.

In the display device 30, by driving of the scanning line drive circuit 35, a video signal written from the signal line 33 via the thin film transistor Tr1 for switching is held in the retention capacitor Cs. Current according to the amount of signal held is supplied from the thin film transistor Tr2 for driving to the organic electroluminescence element EL, and the organic electroluminescence element EL emits light with brightness according to the current value. The thin film transistor Tr2 for driving is connected to a common power supply line (Vcc) 39.

The configuration of the pixel circuit described above is just an example. As necessary, a capacitive element may be provided in the pixel circuit or a pixel circuit may be constructed by providing a plurality of transistors. To the peripheral region 1b, a necessary drive circuit is added according to change in the pixel circuit.

Figure 15:
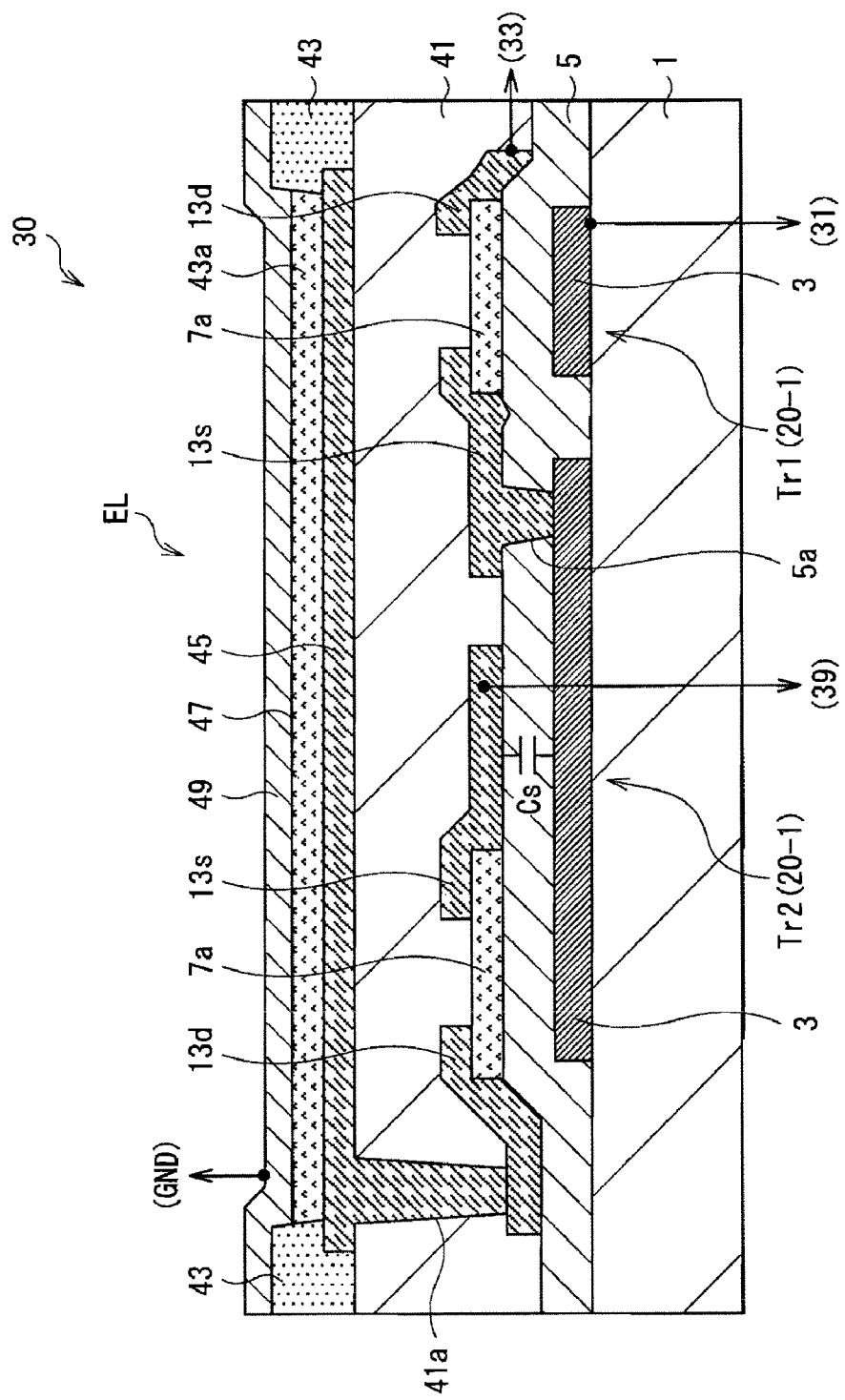
FIG. 15 is a cross section of one pixel in the display device.

FIG. 15 expresses a sectional structure of the display device 30 having the above-described circuit configuration. The diagram illustrates a structure of one pixel in which the thin film transistors Tr2 and Tr1, the capacitive element Cs, and the organic electroluminescence element EL are stacked.

The diagram illustrates an example of providing the thin film transistor 20-1 having the top-contact bottom-gate structure shown in FIG. 2D in the first embodiment as the thin film transistors Tr2 and Tr1 provided for each pixel "a".

The source electrode 13s of the thin film transistor Tr1 and the gate electrode 3 of the thin film transistor Tr2 are connected to each other via a connection hole 5a provided for the gate insulating film 5. The capacitive element Cs is constructed by making the gate insulating film 5 sandwiched between an extension part of the gate electrode 3 in the thin film transistor Tr2 and an extension part of the source electrode 13s. As illustrated also in the circuit diagram of FIG. 14, the gate electrode 3 of the thin film transistor Tr1 is extended to the scanning line 31, the drain electrode 13d of the thin film transistor Tr1 is extended to the signal line 33, and the source electrode 13s of the thin film transistor Tr2 is extended to the power supply line 39.

The thin film transistors Tr1 and Tr2 and the capacitive element Cs are covered, for example, with an interlayer insulating film 41 via a protection film. The interlayer insulating film 41 is preferably constructed as a planarized film. The interlayer insulating film 41 is provided with a connection hole 41a reaching the drain electrode 13d of the thin film transistor Tr2.

Each of the pixels on the interlayer insulating film 41 is provided with the organic electroluminescence element EL connected to the thin film transistor Tr2 via the connection hole 41a. The organic electroluminescence element EL is isolated by an insulating pattern 43 provided on the interlayer insulating film 41.

The organic electroluminescence element EL has a pixel electrode 45 provided on the interlayer insulating film 41. The pixel electrode 45 is formed as a conductive pattern for each pixel and is connected to the drain electrode 13d of the thin film transistor Tr2 via the connection hole 41a provided for the interlayer insulating film 41. Such a pixel electrode 45 is used as, for example, an anode.

The periphery of the pixel electrode 45 is covered with the insulating pattern 43 for isolating the organic electroluminescence element EL. The insulating pattern 43 has an open window 43a for widely exposing the pixel electrode 45. The open window 43a serves as a pixel opening of the organic electroluminescence element EL.

An organic layer 47 is provided so as to cover the pixel electrode 45 exposed from the insulating pattern 43. The organic layer 47 has a stacked structure having at least an organic light emission layer and is obtained by stacking, as necessary, a hole injection layer, a hole transport layer, an organic light emission layer, an electron transport layer, an electron injection layer, and other layers in order from an anode (the pixel electrode 45) side.

A common electrode 49 is provided so as to cover the organic layer 47 and sandwich the organic layer 47 between the pixel electrode 45 and itself. The common electrode 49 is an electrode on the side of extracting light generated by the organic light emission layer in the organic electroluminescence element EL and is made of a material having light transmitting property. In this case, the pixel electrode 45 functions as an anode, so that the common electrode 49 is constructed by using a material which functions as a cathode at least on the side in contact with the organic layer 47. As also shown in the circuit diagram of FIG. 11, the common electrode 49 is disposed at GND.

A pixel part in which the organic layer 47 is sandwiched between the pixel electrode 45 and the common electrode 49 is a part functioning as the organic electroluminescence element EL.

Although not shown, in a state where the formation face side of each organic electroluminescence element EL is covered with an encapsulation resin made of a light transmissive material, and an opposed substrate made of a light transmissive material is adhered via the encapsulation resin, the display device 30 is constructed.

In the display device 30, the pixel circuit is constructed by using a fine thin film transistor having excellent characteristics. Consequently, the pixel electrode 45 is stably driven and microfabrication of the pixel is achieved, so that the display characteristic improves.

In the foregoing embodiments, as an example of the electronic device having the thin film transistor, the display device of the active matrix using the organic electroluminescence element EL is illustrated. The electronic device of the invention is applicable widely to a display device having a thin film transistor such as a liquid crystal display device and an electrophoretic display.

Further, as an embodiment of the electronic device of the invention, the invention is widely applicable to an electronic device having the display device. For example, the invention may be applied to an electric paper, a digital camera, a notebook-sized personal computer, a portable terminal device such as a cellular phone, and an electronic device such as a video camera. That is, the invention is applicable to an electronic device having a display device in all of fields in which a video signal input to the electronic device or a video signal generated in the electronic device is displayed as an image or video image.

Further, the electronic device of an embodiment of the invention is not limited to the display device. The invention is widely applicable to an electronic device having the thin film transistor to which a conductive pattern (such as a pixel electrode) is connected. For example, the invention is applicable also to electronic devices such as an ID tag and a sensor. By using a fine thin film transistor having excellent characteristics in such an electronic device, a miniaturized device is stable driven.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device including a plurality of pixel circuits, each of the plurality of pixel circuits comprising a first thin film transistor, the first thin film transistor comprising:
   an organic semiconductor pattern provided on a gate insulating layer over a substrate; and
   a source electrode and a drain electrode, wherein one end portion of each electrodes is provided directly on the gate insulating layer and the other end portion of each electrodes is formed directly on the organic semiconductor pattern disposed over the substrate in a state where the source electrode and the drain electrode are isolated above the organic semiconductor pattern, and
   wherein at least one of a metal material and a material component of an acid-series etching solution is contained in the surface layer of the organic semiconductor pattern.

2. A display device according to claim 1,
   wherein the pixel circuit further comprising a capacitor to hold video signal,
   and the first transistor samples a video signal to the capacitor from a signal line.

3. A display device according to claim 1,
   wherein the pixel circuit further comprising a capacitor to hold a video signal, and a light emitting element which emits light according to the video signal;
   and the first transistor supplies current to the light emitting element.

4. A display device according to claim 3,
   wherein the pixel circuit further comprising a second transistor to sample a video signal to the capacitor from the signal line,
   the second transistor comprising:
   an organic semiconductor pattern provided on a gate insulating layer over a substrate; and
   a source electrode and a drain electrode, wherein one end portion of each electrodes is provided directly on the gate insulating layer and the other end portion of each electrodes is formed directly on the organic semiconductor pattern disposed over the substrate in a state where the source electrode and the drain electrode are isolated above the organic semiconductor pattern, and
   wherein at least one of a metal material and a material component of an acid-series etching solution is contained in the surface layer of the organic semiconductor pattern.

5. A display device according to claim 4,
   wherein the organic semiconductor pattern of the first transistor and the organic semiconductor pattern of the second transistor are formed on a common insulating layer.

6. An electronic device including a plurality of pixel circuits, each of the plurality of pixel circuits comprising a first thin film transistor, the first thin film transistor comprising:
   an organic semiconductor pattern provided on a gate insulating layer over a substrate; and
   a source electrode and a drain electrode, wherein one end portion of each electrodes is provided directly on the gate insulating layer and the other end portion of each electrodes is formed directly on the organic semiconductor pattern disposed over the substrate in a state where the source electrode and the drain electrode are isolated above the organic semiconductor pattern, and
   wherein at least one of a metal material and a material component of an acid-series etching solution is contained in the surface layer of the organic semiconductor pattern.

7. The electronic device according to claim 6, wherein the pixel circuit further comprising a capacitor to hold a data signal, and the first transistor being configured to control transmission of the data signal between the capacitor and a data line.

8. The electronic device according to claim 6,
   wherein the pixel circuit further comprising a capacitor to hold a data signal, and an electro-optical element which operates a signal transformation between an electronic signal and an optical signal; and
   the first transistor operates voltage-current signal transformation related to the data signal and the electronic signal.

9. The electronic device according to claim 8, wherein the pixel circuit further comprising a second transistor being configured to control transmission of the data signal between the capacitor and a data line, the second transistor comprising:
   an organic semiconductor pattern provided on a gate insulating layer over a substrate; and
   a source electrode and a drain electrode, wherein one end portion of each electrodes is provided directly on the gate insulating layer and the other end portion of each electrodes is formed directly on the organic semiconductor pattern disposed over the substrate in a state where the source electrode and the drain electrode are isolated above the organic semiconductor pattern, and wherein at least one of a metal material and a material component of an acid-series etching solution is contained in the surface layer of the organic semiconductor pattern.

10. The electronic device according to claim 9, wherein the organic semiconductor pattern of the first transistor and the organic semiconductor pattern of the second transistor are formed on a common insulating layer.

11. The electronic device according to claim 9, wherein the electronic device is a sensor device.

12. An electronic device including a plurality of element circuits arranged in a matrix form, each of the plurality of element circuits comprising a first thin film transistor, the first thin film transistor comprising:

an organic semiconductor pattern provided on a gate insulating layer over a substrate; and a source electrode and a drain electrode, wherein one end portion of each electrodes is provided directly on the gate insulating layer and the other end portion of each electrodes is formed directly on the organic semiconductor pattern disposed over the substrate in a state where the source electrode and the drain electrode are isolated above the organic semiconductor pattern, and wherein at least one of a metal material and a material component of an acid-series etching solution is contained in the surface layer of the organic semiconductor pattern.

* * * * *